US009185802B2

(12) United States Patent  
Matsuda

(10) Patent No.: US 9,185,802 B2  
(45) Date of Patent: Nov. 10, 2015

(54) FLEXIBLE PRINTED CIRCUIT BOARD WITH COMPONENT MOUNTING SECTION FOR MOUNTING ELECTRONIC COMPONENT AND FLEXIBLE CABLES EXTENDING IN DIFFERENT DIRECTIONS FROM THE COMPONENT MOUNTING SECTION, AND METHOD OF MANUFACTURING THE SAME

(75) Inventor: Fumihiko Matsuda, Ryugasaki (JP)

(73) Assignee: NIPPON MEKTRON, LTD., Tokyo (JP)

( * ) Notice: Subject to any disclaimer, the term of this patent is extended or adjusted under 35 U.S.C. 154(b) by 475 days.

(21) Appl. No.: 13/138,752

(22) PCT Filed: Dec. 7, 2010

(86) PCT No.: PCT/JP2010/071898  
§ 371 (c)(1),  
(2), (4) Date: Sep. 23, 2011

(87) PCT Pub. No.: WO2012/014339  
PCT Pub. Date: Feb. 2, 2012

(65) Prior Publication Data  
US 2012/0175154 A1 Jul. 12, 2012

(30) Foreign Application Priority Data  
Jul. 26, 2010 (JP) ................................ 2010-167411

(51) Int. Cl.  
*H05K 1/00* (2006.01)  
*H05K 1/14* (2006.01)  
*H05K 3/00* (2006.01)  
*H05K 1/11* (2006.01)

(52) U.S. Cl.  
CPC .............. *H05K 1/142* (2013.01); *H05K 3/0097* (2013.01); *H05K 1/118* (2013.01); *H05K 2201/052* (2013.01)

(58) Field of Classification Search  
USPC ....... 174/254, 72 R, 250, 255, 256, 260, 261, 174/267, 268  
See application file for complete search history.

(56) References Cited

U.S. PATENT DOCUMENTS

| 5,086,652 | A | 2/1992 | Kropp | |
|---|---|---|---|---|
| 7,053,294 | B2 * | 5/2006 | Tuttle et al. | 136/265 |
| 7,952,885 | B2 * | 5/2011 | Loibl et al. | 361/749 |
| 2009/0260867 | A1 * | 10/2009 | Huang et al. | 174/261 |

FOREIGN PATENT DOCUMENTS

| GB | 2 203 905 A | 10/1988 |
|---|---|---|
| JP | 05-075270 | 3/1993 |
| JP | 2002-217503 | 8/2002 |
| JP | 2004-014894 | 1/2004 |
| JP | 2007-128970 | 5/2007 |
| JP | 2008-235745 | 10/2008 |
| JP | 2010-040949 | 2/2010 |

OTHER PUBLICATIONS

The European Search Report mailed on Apr. 10, 2015 to a corresponding European patent application.

* cited by examiner

*Primary Examiner* — Tremesha S Willis  
(74) *Attorney, Agent, or Firm* — Jacobson Holman, PLLC

(57) ABSTRACT

A method of manufacturing a flexible printed circuit board that includes a component mounting section having lands, a plurality of flexible cable sections having wirings and extending in different directions from the component mounting section, and a connection section having terminals connected with the land through the wiring, the method including manufacturing partial FPCs in a sheet in a unit of a partial FPC that includes a partial component mounting section that is a part of the component mounting section, a cable section extending from the partial component mounting section, and a connection section disposed in the cable section, cutting out the partial FPC from the sheet, performing an alignment using alignment targets of the partial FPC and a support plate so that the partial component mounting sections of respective partial FPCs configure the component mounting section, and fixing the partial FPCs onto the support plate.

8 Claims, 19 Drawing Sheets

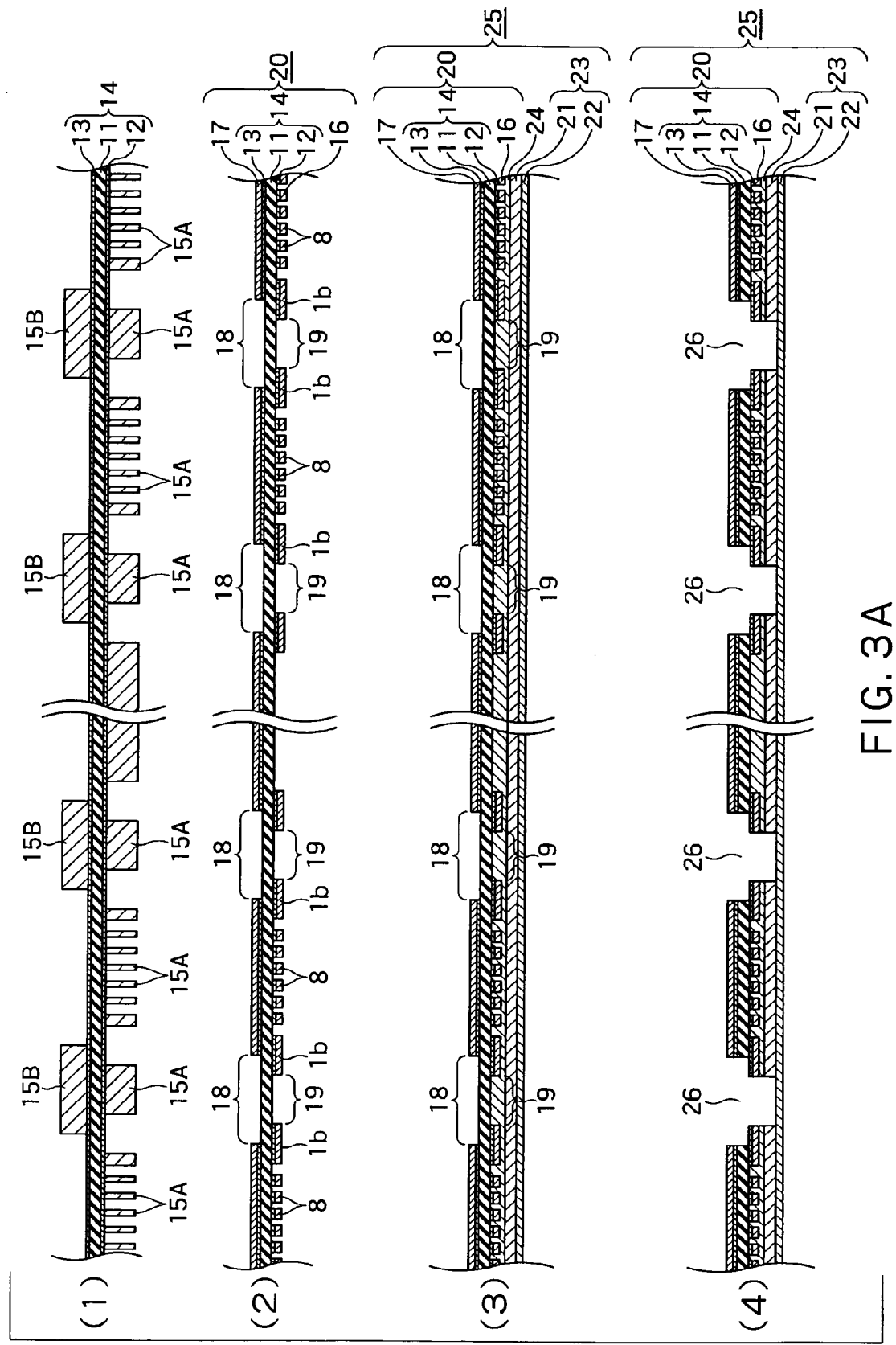

FLEXIBLE PRINTED CIRCUIT BOARD WITH COMPONENT MOUNTING SECTION FOR MOUNTING ELECTRONIC COMPONENT AND FLEXIBLE CABLES EXTENDING IN DIFFERENT DIRECTIONS FROM THE COMPONENT MOUNTING SECTION, AND METHOD OF MANUFACTURING THE SAME

This is a national stage of PCT/JP10/071898 filed Dec. 7, 2010 and published in Japanese, which claims the priority of Japanese number 2010-167411 filed Jul. 26, 2010, hereby incorporated by reference.

TECHNICAL FIELD

The present invention relates to a printed circuit board and a method of manufacturing the same, and more particularly, to a flexible printed circuit board having a plurality of cable sections that extend in different directions from a component mounting section for mounting an electronic component and a method of manufacturing the same.

BACKGROUND ART

In recent years, electronic components have been becoming more and more miniaturized and high functional. For this reason, demands for a densified printed circuit board or an electronic component mounted thereon are increasing. Particularly, in a package component used in a portable device, for example a chip size package (CSP), the number of pins increases, and a pitch between pins is getting narrow. For example, in the case of a sensor module in which many sensors are integrated, the number of pins is proportional to the number of sensors, and the number of pins ranges from several hundreds to several thousands. Further, a pitch between pins has gotten narrow up to about 500 μm.

As a flexible printed circuit board that is advantageous in mounting a package component having many pins and a narrow pitch such as the CSP, a so-called step via structure has been known (for example, Patent Document 1). The overall manufacturing method thereof is as follows.

First, a fine wiring is formed on a core substrate that is an inner layer, and thereafter a build-up layer that is an outer layer is stacked on the core substrate. A step via hole of a step form composed of an upper hole having a large diameter and a lower hole having a small diameter is formed by a conformal laser process. Thereafter, a plating process is performed on an inner wall of the step via hole, so that a step via functioning as an interlayer conductive path is formed. By employing the step via structure, a wiring of the outer layer can be miniaturized, and thus a flexible printed circuit board that is advantageous in mounting a package component having many pins and a narrow pitch can be obtained.

However, in the case of the above described sensor module, the pins of the sensor module are installed to output signals of the sensors associated with the pins. For this reason, the flexible printed circuit board for mounting the sensor module needs to have many fine wirings for electrically connecting the pins of the sensor module to terminals installed in a contact section connected with an external device. Further, according to a use form of the flexible printed circuit board, there is a case in which it is necessary to draw out a plurality of cable sections including the wirings in different directions from a mounting area of an electric component. An example of such a flexible printed circuit board will be described in detail with reference to the drawings.

FIG. 7(1) is a plan view of a conventional flexible printed writing board 44 on which an electronic component having many pins with a narrow pitch are mounted. FIG. 7(2) is a cross-sectional view taken along line A-A of FIG. 7(1). However, these drawings do not illustrate an internal structure of a component mounting section 41.

As illustrated in FIG. 7(1), the flexible printed circuit board 44 includes a component mounting section 41 for mounting an electronic component thereon, a plurality of flexible cable sections 42 respectively extending in up, down, right, and left directions from the component mounting section 41, and connection sections 43 respectively installed at forefronts of the flexible cable sections 42.

The component mounting section 41 has a plurality of lands 41a for being bonded with pins of the electronic component such as a sensor module.

The flexible cable section 42 has flexibility and extends in a predetermined direction from the component mounting section 41. Further, the flexible cable section 42 has a plurality of fine wirings (not shown) for electrically connecting the land 41a with a terminal 43a of the connection section 43.

The connection section 43 has a plurality of terminals 43a for a connection with an external device.

Each of the plurality of terminals 43a is electrically connected with the land 41a corresponding thereto through the wiring of the flexible cable section 42.

Next, a state in which an electronic component is mounted on the flexible printed circuit board. 44 will be described with reference to FIG. 8.

FIG. 8(1) is an enlarged plan view of the component mounting section 41 on which an electronic component 45 is mounted, and FIG. 8(2) is a cross-sectional view taken along line A-A of FIG. 8(1). As illustrated in FIG. 8(2), a pin (solder ball) 45a of the electronic component 45 is bonded with a corresponding land 41a of the component mounting section 41.

As can be seen from FIG. 8(2), a wiring 46 for electrically connecting the land 41a with the terminal 43a is installed between step vias 47 and 47 that are used for interlayer connection.

The electronic component 45 is, for example, a sensor module, and in this case, a signal of a sensor included in the sensor module is output from the pin 45a and transmitted to the terminal 43a through the land 41a, the step via 47, and the wiring 46.

Incidentally, in an actual process of manufacturing a flexible printed circuit board, a sheet of a predetermined size comparting a long material (for example, a copper-clad laminated sheet having a copper foil on an insulating film) is used as a process target unit of various processes. Thus, manufacturing is performed in a state in which a plurality of flexible printed circuit boards are arranged in a sheet according to a predetermined layout. How to arrange the flexible printed circuit boards in the sheet (i.e., a sheet layout) is decided in advance. FIG. 9 is a plan view of a sheet 48 having 9 flexible printed circuit boards 44 manufactured according to a predetermined layout.

As can be seen from FIG. 9, since the area of the flexible printed circuit board 44 is large and the flexible cable sections 42 are installed to extend in up, down, right, and left directions from the component mounting section 41, a degree of freedom of the sheet layout is limited, and it is difficult to arrange the flexible printed circuit board 44s in a more efficient fashion within the sheet 48.

As described above, in the past, it was impossible to achieve the efficient sheet layout due to the restriction attributable to the outer shape of the flexible printed circuit board or the like. As a result, it has been difficult to reduce the manufacturing cost of the flexible printed circuit board.

Further, in the past, in addition to the above described sheet layout problem, there has been a problem that a yield decreases due to a wiring failure. This will be described using an example of the flexible printed circuit board 44. As described above, a plurality of wirings 46 are installed between the step vias 47, but since the electronic component 45 has significantly many pins, a pitch of the wiring 46 becomes finer to the most extent as a wiring pitch installed in the flexible printed circuit board 44. For example, when an interval of inner layer lands 41b installed on the same layer as the wiring 46 is 200 μm and 6 wirings are installed between the inner layer lands 41b as illustrated in FIG. 8(2), the wiring pitch is just about 30 μm. It is necessary to form a fine wiring pitch for a wiring pitch in the flexible cable section 42 as well as the component mounting section 41.

In forming a wiring, when a foreign substance whose size is almost equal to or more than an interval between wirings sticks to a wiring area or an exposure mask, a wiring failure occurs. For this reason, the larger the wiring area is, the higher the probability that wiring failure will be caused by sticking of the foreign substance is, and thus the lower the yield is.

As described above, an area of the flexible printed circuit board 44 in which the fine wiring ranges over the flexible cable section 42 as well as the component mounting section 41. It is not actually easy to form the fine wiring in an area having the relatively large area size without any defect, and thus a reduction in the yield has been unavoidable in the related art.

The problems of the related art have been described in connection with the example of the multi-layer flexible printed circuit board having the step via structure, but the above problems of the sheet layout and the yield are not caused by the step via structure or the multi-layer structure.

Further, a technique related to a so-called replacement substrate has been disclosed in the past (Patent Document 2 and Patent Document 3). When a failure occurs on an aggregated substrate composed of a plurality of unit substrates, by selectively replacing a defective unit substrate with a good one, the aggregated substrate becomes a good product. Thus, it can be understood that the above-described problem cannot be solved by this technique.

CITATION LIST

Patent Documents

Patent Document 1: Japanese Patent Application Laid-Open (JP-A) No. 2007-128970
Patent Document 2: Japanese Patent Application Laid-Open (JP-A) No. 2008-235745
Patent Document 3: Japanese Patent Application Laid-Open (JP-A) No. 2010-40949

DISCLOSURE OF INVENTION

Problems to be Solved by the Invention

An object of the present invention is to allow an efficient sheet layout and thus to improve the yield in manufacturing a flexible printed circuit board having a plurality of cable sections that extend in different directions from a component mounting section.

Means for Solving the Problems

According to a first aspect of the present invention, a method of manufacturing a flexible printed circuit board is provided which includes a component mounting section for mounting an electronic component and a plurality of flexible cable sections extending in different directions from the component mounting section, the method including manufacturing a plurality of partial flexible printed circuit boards in a predetermined sheet in a unit of the partial flexible printed circuit board including a partial component mounting section formed by dividing the component mounting section into the predetermined number of parts and a flexible cable section extending from the partial component mounting section among the plurality of flexible cable sections, cutting an area including the partial flexible printed circuit board away from the sheet, performing a positional alignment of the predetermined number of partial flexible printed circuit boards such that the predetermined number of partial component mounting sections are combined to configure the component mounting section, and fixing the predetermined number of aligned partial flexible printed circuit boards to a support plate.

According to a second aspect of the present invention, a flexible printed circuit board is provided which includes a predetermined number of partial flexible printed circuit boards, each of which includes a partial component mounting section formed by dividing a component mounting section for mounting an electronic component into the predetermined number of parts and a flexible cable section extending from the partial component mounting section, and a support plate which fixes the predetermined number of partial flexible printed circuit boards in such a manner that the predetermined number of partial component mounting sections are combined to configure the component mounting section.

According to a third aspect of the present invention, a method of manufacturing a flexible printed circuit board is provided which includes manufacturing a plurality of first partial flexible printed circuit boards, each including a first partial component mounting section having a first land formed on a surface thereof and a flexible cable section extending from the first partial component mounting section, manufacturing a plurality of second partial flexible printed circuit boards, each including a second partial component mounting section having a second land formed on a surface thereof and an interlayer conduction path electrically connected with the second land and a flexible cable section extending from the second partial component mounting section, forming a lower flexible printed circuit board by performing an positional alignment so that the first partial component mounting sections of the two first partial flexible printed circuit board can configure a lower component mounting section and then fixing the two first partial flexible printed circuit boards onto a support plate, forming an upper flexible printed circuit board by performing a positional alignment so that the second partial component mounting sections of the two second partial flexible printed circuit board can configure an upper component mounting section and then fixing the two second partial flexible printed circuit boards onto an anisotropic conductive film containing a conductive particle, and forming a component mounting section including the upper component mounting section and the lower component mounting section in which the first land is electrically connected with the second land positioned directly thereon through the conductive particle and the interlayer conduction path by placing the upper flexible printed circuit board on the lower flexible printed circuit board and applying heat and pressure thereto.

According to a fourth aspect of the present invention, a flexible printed circuit board is provided which includes: a support plate; a first partial flexible printed circuit board including a first partial component mounting section having a first land formed on a surface thereof and a first interlayer conduction path electrically connected with the first land, and a flexible cable section extending from the first partial component mounting section; and a second partial flexible printed circuit board including a second partial component mounting section having a second land formed on a surface thereof and a second interlayer conduction path electrically connected with the second land, and a flexible cable section extending from the second partial component mounting section; in which a lower component mounting section configured such that the two first partial component mounting sections are arranged on the same plane is fixed onto the support plate, an upper component mounting section configured such that the two second partial component mounting sections are arranged on the same plane is stacked on the lower component mounting section through an anisotropic conductive layer having a conductive particle therein, and the first land is electrically connected with the second land positioned directly thereon through the conductive particle and the second interlayer conduction path.

Effects of the Invention

The present invention has the following effects due to these features.

According to an embodiment of the present invention, a plurality of partial flexible printed circuit boards are manufactured in a sheet on a unit basis, each unit including a partial component mounting section formed by dividing a component mounting section for mounting an electronic component into the predetermined number of parts and a flexible cable section extending from the partial component mounting section. For this reason, the area size of the manufacturing unit decreases, and the number of extending directions of the flexible cable sections decreases. Thus, a degree of freedom of the sheet layout is enhanced, and the efficient sheet layout is allowed. As a result, the number of flexible printed circuit boards obtained from one sheet can increase.

Further, since manufacturing is performed in a unit of a partial flexible printed circuit board having an area size smaller than an original flexible printed circuit board, parts that should be discarded when a wiring failure or the like occurs decreases. As a result, the yield can be improved.

Further, the partial flexible printed circuit board is cut from the sheet, and thereafter a predetermined number of partial flexible printed circuit boards are aligned so that a predetermined number of partial component mounting sections can be combined to configure a component mounting section and then fixed to a support plate. Thus, the flexible printed circuit board having the same function as the conventional art can be obtained.

According to another embodiment of the present invention, by configuring the component mounting section of the flexible printed circuit board at two stages of an upper component mounting section and a lower component mounting section, the number of wirings formed in one partial component mounting section decreases. Thus, the wiring density can be alleviated, and a failure caused by wiring formation can decrease.

BRIEF DESCRIPTION OF THE DRAWINGS

FIG. 3A is a process cross-sectional view illustrating a method of manufacturing a flexible printed circuit board according to the first embodiment.

BEST MODE(S) FOR CARRYING OUT THE INVENTION

Figure 1:
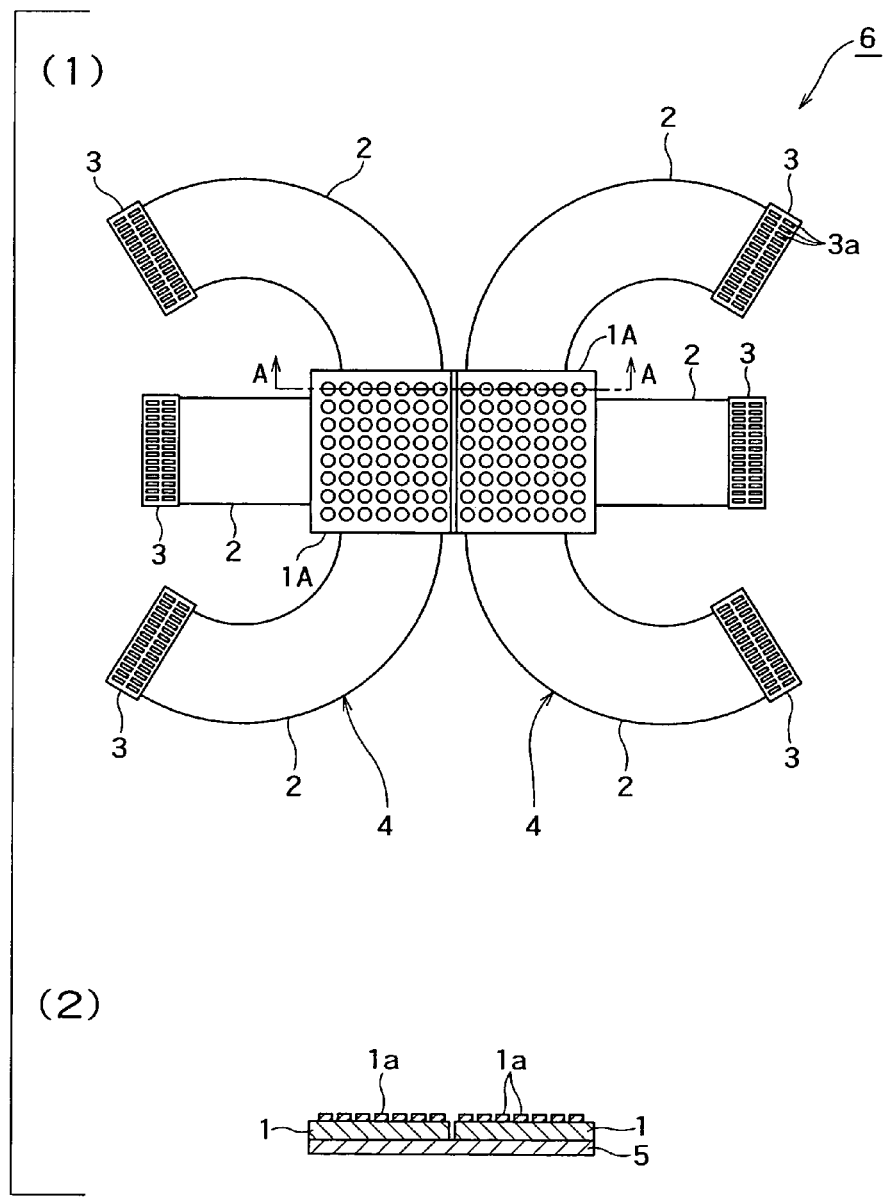
FIG. 1(1) is a plan view of a flexible printed circuit board according to a first embodiment of the present invention, and FIG. 1(2) is a cross-sectional view taken along line A-A of FIG. 1(1).

Hereinafter, two embodiments according to the present invention will be described with reference to the accompanying drawings. In the drawings, components having the same function are denoted by the same symbols, and a description of components having the same symbol will not be repeated.

First Embodiment

FIG. 1(1) is a plan view of a flexible printed circuit board 6 according to a first embodiment of the present invention. FIG. 1(2) is a cross-sectional view taken along line A-A of FIG. 1(1). As can be seen from FIGS. 1(1) and 1(2), the flexible printed circuit board 6 includes left and right partial flexible printed circuit boards (partial FPC) 4 and a support plate 5 and has the same function as the above described flexible printed circuit board 44.

The two partial flexible printed circuit boards 4 are fixed onto the support plate 5 in a state in which partial component mounting sections 1A are aligned with high accuracy and combined to configure a component mounting section 1 for mounting an electronic component. At this point, in terms of a correspondence with the above described conventional flexible printed circuit board 44, the partial flexible printed circuit board 4 corresponds to left or right part of the flexible printed circuit board 44 which is divided into two parts, keeping an internal wiring from being cut apart.

As illustrated in FIG. 1(1), the partial flexible printed circuit board 4 includes a partial component mounting section 1A, three flexible cable sections 2 that extend in up, down, and left (or right) directions from the partial component mounting section 1A, connection sections 3 respectively installed at leading ends of the flexible cable sections 2.

The partial component mounting section 1A includes a plurality of lands 1a for being bonded with pins of an electronic component such as a sensor module. The partial component mounting section 1A is left or right part of the component mounting section 1 divided into two parts. Thus, the component mounting section 1 is configured by combining the two partial component mounting sections 1A.

The flexible cable section 2 has flexibility and extends from the partial component mounting section 1A in a predetermined direction. The flexible cable section 2 has a plurality of fine wirings (not shown) that electrically connect the lands 1a with terminals 3a of the connection section 3.

The connection section 3 is, for example, a connector and has a plurality of terminals 3a for connection with an external device. The plurality of terminals 3a are electrically connected with the lands 1a associated therewith through the wirings of the flexible cable section 2, respectively.

Figure 2:
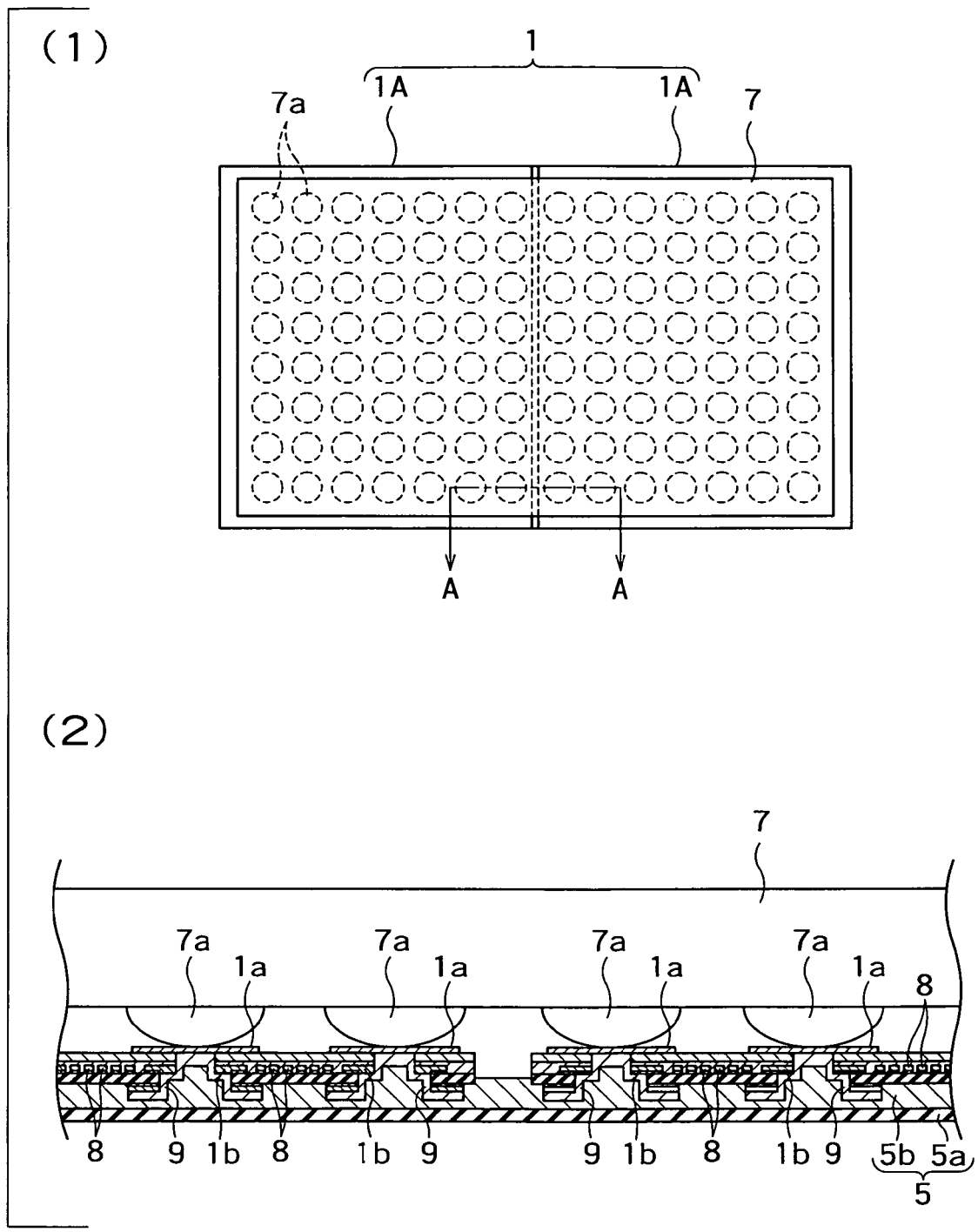
FIG. 2(1) is an enlarged plan view illustrating a state in which an electronic component is mounted on a component mounting section according to the first embodiment, and FIG. 2(2) is a cross-sectional view taken along line A-A of FIG. 2(1).

FIG. 2(1) is an enlarged plan view illustrating a state in which an electronic component 7 such as a sensor module is mounted on the component mounting section 1 including the two partial mounting sections 1A fixed to the support plate 5. FIG. 2(2) is a cross-sectional view taken along line A-A of FIG. 2(1). As illustrated in FIG. 2(2), a pin (solder ball) 7a of the electronic component 7 is bonded to the land 1a.

As can be seen from FIG. 2(2), a wiring 8 for electrically connecting the land 1a with the terminal 3a is installed between step vias 9 and 9 that are used for interlayer connection.

The electronic component 7 is, for example, a sensor module, and in this case, a signal of a sensor included in the sensor module is output from the pin 7a and transmitted to the terminal 3a through the land 1a, the step via 9, and the wiring 8. The connection section 3 in which the terminal 3a is installed may be connected with a printed circuit board (not shown) that processes a sensor signal.

The support plate 5 fixes the left and right two partial flexible printed circuit boards 4A so that the two partial component mounting sections 1A can be combined to configure the component mounting section 1. As illustrated in FIG. 2(2), as the support plate 5, a coverlay having an insulating film 5a and an adhesive material layer 5b thereon may be used.

As a material of the support plate 5, an aramid resin film having an adhesive layer is preferably used. It is because the aramid resin film has small thermal expansion coefficient, and thus the aramid resin film does not nearly expand during a heating process for bonding the partial flexible printed circuit boards 4 with the support plate 5 and can also retain flexibility. As the support plate 5, a material less expanding and contracting is preferably used in order to prevent a misalignment caused by the heating process during bonding and by a mechanical stress during handling. For example, a polyimide film or a liquid crystal polymer film may be used as the insulating film 5a.

Next, a method of manufacturing the flexible printed circuit board 6 according to the present embodiment will be described with reference to the drawings.

Figure 3B:
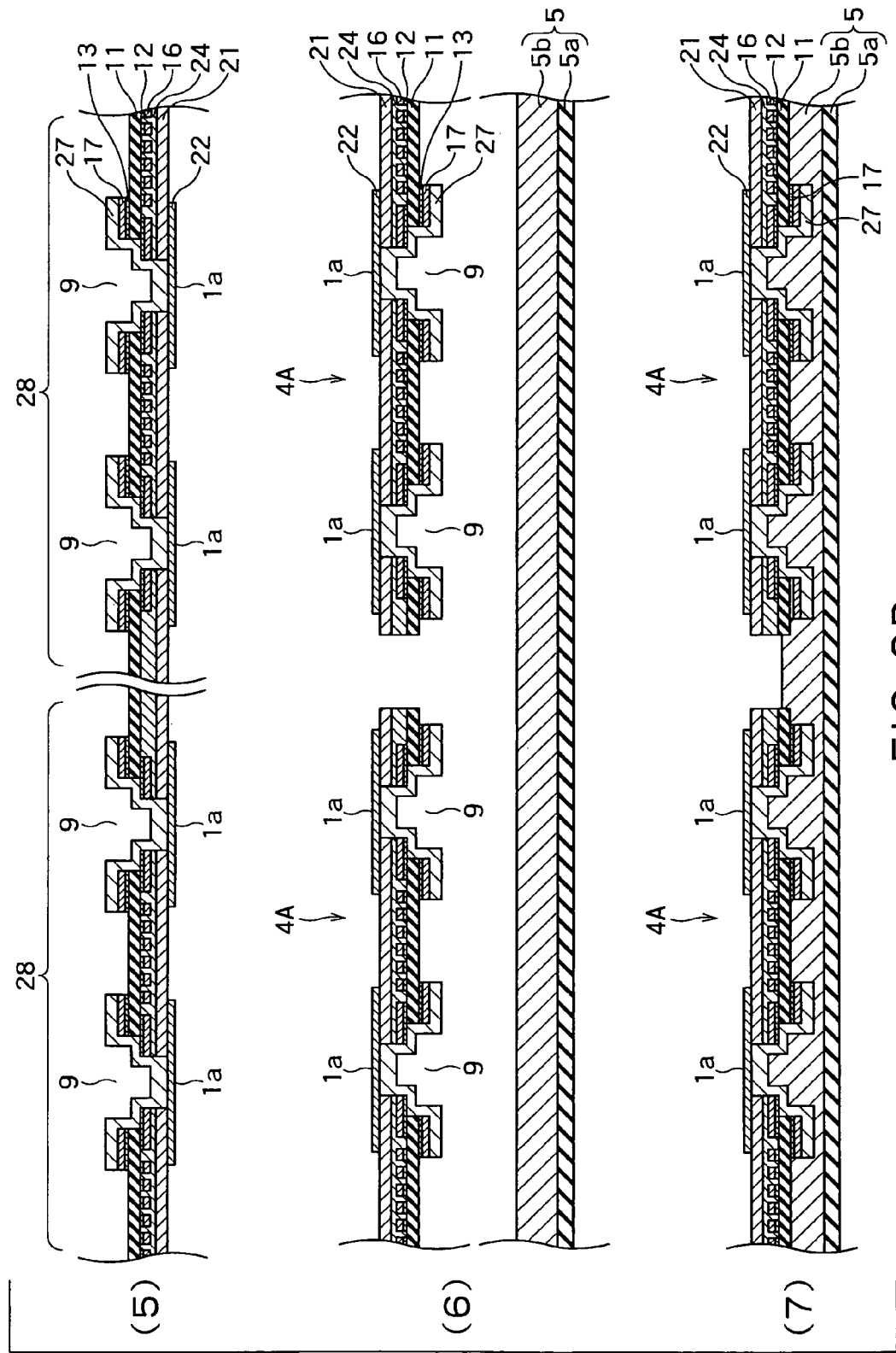
FIG. 3B is a process cross-sectional view illustrating a method of manufacturing a flexible printed circuit board according to the first embodiment, subsequent to FIG. 3A.

FIGS. 3A and 3B are process cross-sectional views illustrating a method of manufacturing the flexible printed circuit board 6.

(1) First, prepared is a flexible double-side copper-clad laminated sheet 14 in which a copper foil 12 and a copper foil 13 (each of which has, for exam, the thickness of 1 μm) are disposed on both sides of a flexible insulating base material (for example, the thickness of 25 μm) made of, for example, a polyimide film. Then, as illustrated in FIG. 3A(1), on a predetermined sheet of the long double-side copper-clad laminated sheet 14, plating resist layers 15A and 15B are formed on the cooper foil 12 positioned on an inner layer side and the cooper foil 13 positioned on an outer layer side, respectively. The plating resist layers 15A and 15B are used to form a desired conductive film pattern by a semi-additive technique.

The plating resist layer 15B is a plating resist layer for forming a laser shielding mask, which functions when forming a step via hole by a laser process later, by the semi-additive technique. Further, the thickness of the plating resist layer 15B is preferably about 1.2 to 2 times the thickness of a wiring layer to be formed. Here, the design thickness of the wiring is set to 10 μm, and the thickness of the plating resist layer 15B is set to 15 μm.

(2) Next, an electrolyte copper plating process is performed on both sides of the double-side copper-clad laminated sheet 14 on which the plating resist layers 15A and 15B are formed. As a result, as can be seen from FIG. 3A(2), electrolyte copper plating layers 16 and 17 are formed on portions of the copper foils 12 and 13 exposed through openings of the plating resist layers 15A and 15B, respectively. Here, the electrolyte copper plating layers 16 and 17 are set to 10 μm in thickness, respectively. After the electrolyte copper plating process, the plating resist layers 15A and 15B are removed, and the copper foils 12 and 13 (seed layers) that are no covered with the electrolyte plating layers 16 and 17 are removed by so-called flash etching.

Through the processes up to this point, a double-side circuit base material 20 illustrated in FIG. 3A(2) is obtained. Conformal masks 18 and 19, which function as laser shielding masks when the step via hole is formed later, have been formed on the top surface and the back surface of the double-side circuit base material 20. The conformal mask 18 becomes a mask for forming an upper hole of the step via hole, and the conformal mask 19 becomes a mask for forming a lower hole of the step via hole. The formal masks 18 and 19 are, for example, φ100 μm and φ70 μm in diameter, respectively. Further, a plurality of fine wirings 8 have been formed on the back side of the double-side circuit base material 20. 6 wirings 8 are installed between the inner layer lands 1b, and a wiring pitch is, for example, 30 μm.

(3) Next, a single-side copper-clad laminated sheet 23 having a copper foil 22 (for example, the thickness of 12 μm) is prepared on one side of the flexible insulating base material 21 (for example, a polyimide film having the thickness of 25 μm). As illustrated in FIG. 3A(3), the single-side copper-clad laminated sheet 23 is laminated on the back side of the double-side circuit base material 20 through an adhesive material layer 24 (for example, the thickness of 15 μm). Further, the adhesive material layer 24 is preferably formed by using an adhesive of which a flow index is small, such as prepreg of a low flow type or a bonding sheet.

A multi-layer circuit base material 25 illustrated in FIG. 3A(3) is obtained through the processes up to this point.

(4) Next, as illustrated in FIG. 3A(4), step via holes 26 are formed by irradiating laser light onto the surface of the multi-layer circuit base material 25 and performing a conformal laser process using the conformal masks 18 and 19.

In the laser process technique of the present process, a laser such as a UV-YAG laser, a carbon dioxide laser, or an excimer laser may be used. It is preferable to use the carbon dioxide laser in terms of advantages of high processing speed and productivity.

As a more detailed process condition, ML605GTXIII-5100 U2 available from Mitsubishi Electric Corporation was used as a carbon dioxide laser processing machine. The laser beam diameter was adjusted to 200 μm using a predetermined aperture or the like. The pulse width was 10 μsec, and the pulse energy was set to 5 mJ. The laser process was performed under the condition, an irradiation of 5 shots of a laser pulse for formation of one step via hole.

(5) Next, a desmear process and a conduction process are performed on the inside of the step via hole 26, and thereafter the electrolyte copper plating process is performed on the whole surface of the multi-layer circuit base material 25 with the step via hole formed therein. As a result, as can be seen from FIG. 3B(5), an electrolyte copper plating layer 27 is formed on an inner wall (a side and a bottom) of the step via hole 26 and the electrolyte copper layer 17. Accordingly, a step via 9 that functions as an interlayer conduction path is formed. Further, in order to secure interlayer conduction, the thickness of the electrolyte copper plating layer 27 is set to, for example, 15 to 20 μm.

In the plating process of the present process, since an open surface through the step via hole 26 is provided only at the top surface side of the multi-layer circuit base material 25, so-called single-side plating of performing the plating process only on the open surface of the step via hole 26 is performed. For this reason, the electrolyte copper plating layer is not formed on the copper foil 22 on the back side of the multi-layer circuit material 25. The single-side plating may be implemented by forming a plating mask to cover the cooper foil 22 on the back side and thereafter performing the plating process, or may be implemented by installing a shielding plate in a plating device, a plating jig, or the like and thereafter performing the plating process. By performing the single-side plating rather than the double-side plating, an extra copper plating film is not formed on the copper foil 22, and the film thickness of the copper foil 22 can be prevented from increasing. As a result, a fine pattern having a land or the like can be formed by processing the copper foil 22 that remains thin.

Thereafter, as illustrated in FIG. 3B(5), an outer layer pattern 28 and the land 1a are formed by processing the electrolyte copper plating layer 27 and the copper foil 22 into predetermined patterns, respectively, by a photofabrication technique. The photofabrication technique refers to a processing technique of patterning a processing target layer (copper foil etc.) into a predetermined pattern and includes a series of processes such as forming a resist layer on a processing target layer, exposing, developing, etching a processing target layer, and peeling off a resist layer.

At this point, the layout of the partial flexible printed circuit boards manufactured in the sheet will be described.

Figure 4:
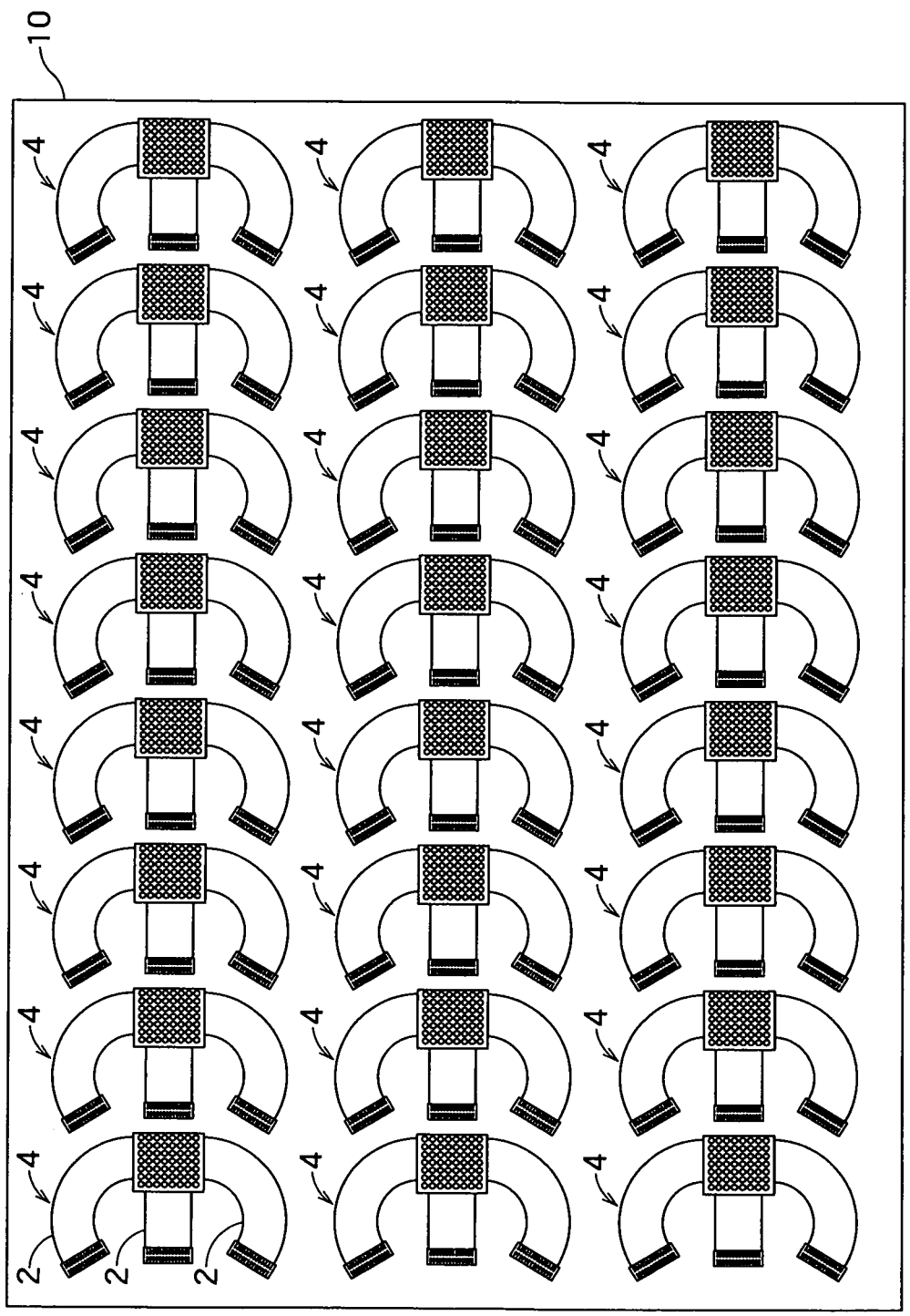
FIG. 4 is a plan view illustrating a plurality of partial flexible printed circuit boards, which is manufactured in a sheet, according to the first embodiment.

FIG. 4 is a plan view illustrating a plurality of partial flexible printed circuit boards manufactured in a sheet having the same size as the above described sheet 48. As can be seen from FIG. 4, the flexible cable sections 2 of the partial flexible printed circuit board 4 extends in three directions, that is, up, down, and left directions. On the other hand, in the above described flexible printed circuit board 44, the flexible cable sections 42 extend in four directions, that is, up, down, left, and right directions. That is, the partial flexible printed circuit board 4 is smaller than the flexible printed circuit board 44 in the number of extending directions of the flexible cable sections.

Further, the area size of the partial flexible printed circuit board 4 is about half the flexible printed circuit board 44.

Figure 9:
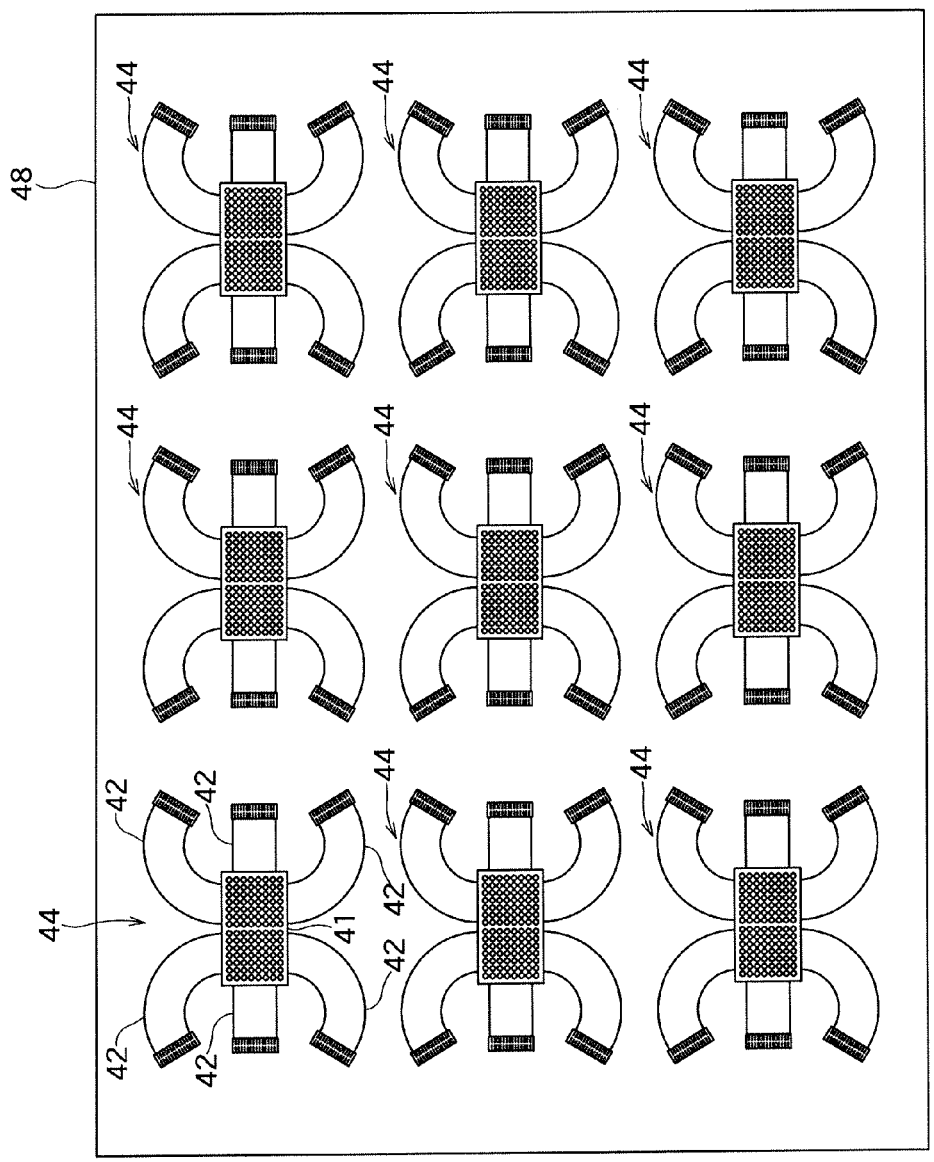
FIG. 9 is a plan view of a plurality of conventional flexible printed circuit boards manufactured in a sheet.

By arranging the partial flexible printed circuit board 4 that is small in area size and in number of extending directions of the flexible cable sections inside the sheet 10, the efficient sheet layout can be achieved. As a result, the number of flexible printed circuit boards obtained from one sheet can increase. Specifically, as illustrated in FIG. 4, in the case of the present embodiment, since 24 partial flexible printed circuit boards can be arranged from one sheet 10, it is possible to obtain a maximum of 12 flexible printed circuit boards 4. Meanwhile, in the above described conventional example, as illustrated in FIG. 9, at the most 9 flexible printed circuit boards can be obtained.

Figure 5:
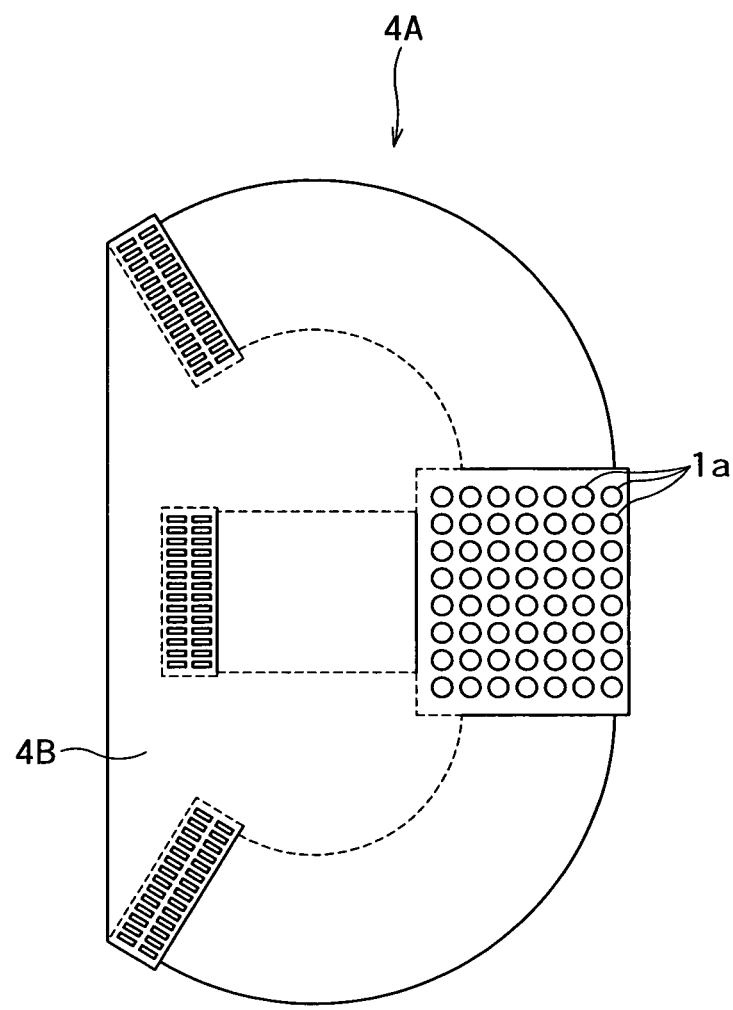
FIG. 5 is a plan view of a partial flexible printed circuit board containing an unnecessary area, which is cut from a sheet, according to the first embodiment.

(6) Next, a plurality of partial flexible printed circuit boards 4A are cut apart from the sheet 10 using a mold or the like. As illustrated in FIG. 5, the cut partial flexible printed circuit board 4A includes an area 4B to be finally removed. That is, the partial flexible printed circuit board 4 is one obtained by cut away the area 4B along a dotted line of FIG. 5 from the partial flexible printed circuit board 4A. Further, the partial flexible printed circuit board may be cut out in a form containing no area 4B. Further, from a point of view of productivity improvement, a plurality of partial flexible printed circuit boards 4A manufactured in the sheet 10 are preferably collectively cut out.

A failure judgment is performed on the cut partial flexible printed circuit board 4A to remove a failure such as a wiring failure.

Figure 6:
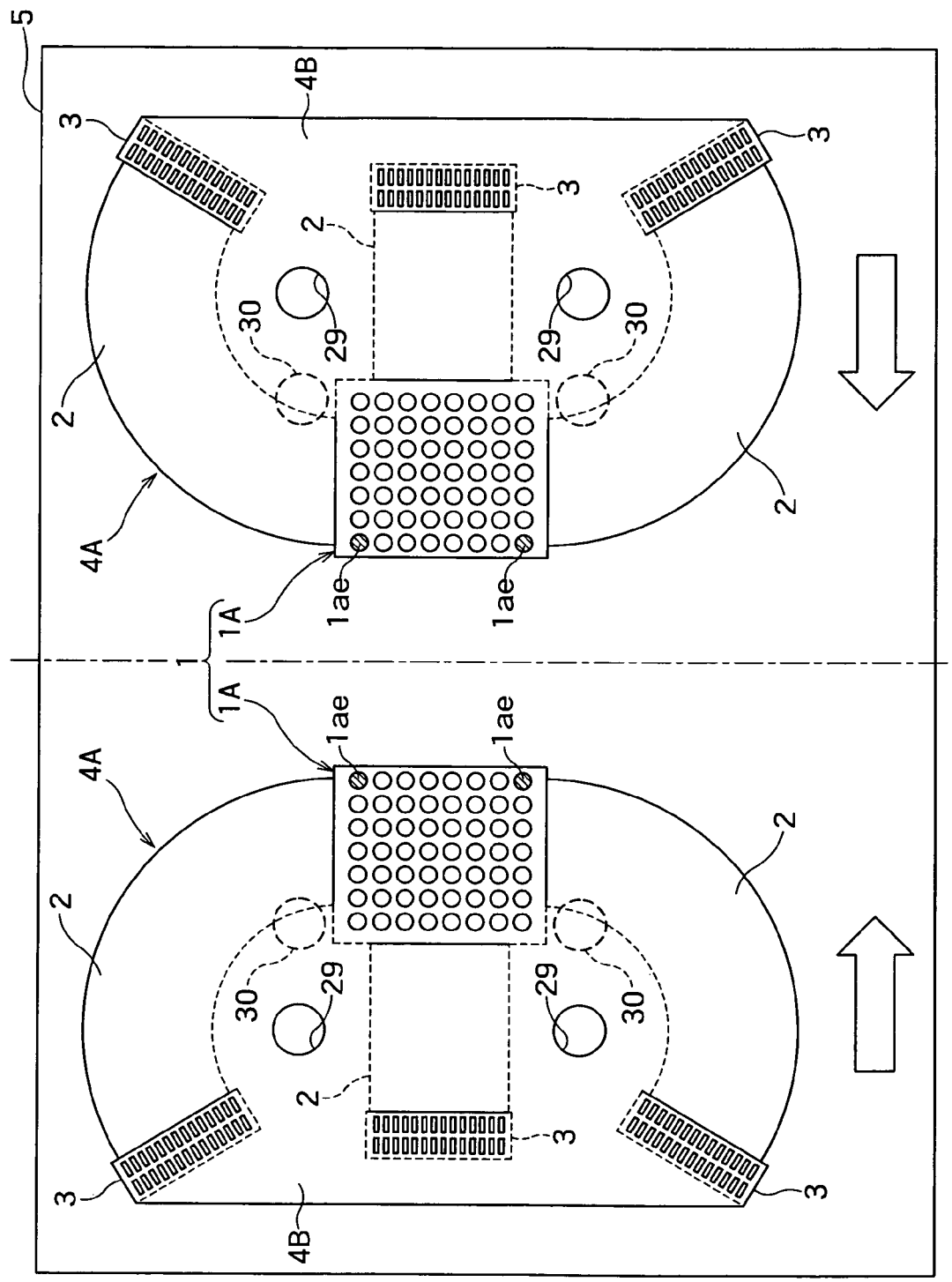
FIG. 6 is an explanation view of an alignment method of a partial flexible printed circuit board according to the first embodiment.

(7) Next, as illustrated in FIG. 6 and FIG. 3B(6), the alignment of the two partial flexible printed circuit boards 4A that have been judged as non-defective ones is performed by using alignment targets 29 and 30 respectively formed on the partial flexible printed circuit boards 4A and the support plate 5. The alignment targets 29 and 30 may include a guide hole, an alignment mark, or the like formed at a high degree of accuracy by a technique which will be described later.

The alignment of the present process needs be performed with high accuracy so that the two partial component mounting sections 1A can configure the component mounting section 1. Specifically, it depends on a type of an electronic component to be mounted, the size thereof, and a pitch between pins, but a degree of alignment accuracy of about ±50 μm is usually required.

For this reason, an apparatus having the same function as a chip mounter used during mounting of an electronic component is used for the alignment of the present process. That is, the alignment targets 29 and 30 are image-recognized, and the positions of the partial flexible printed circuit boards 4A are adjusted so that the alignment targets 29 and 30 can overlap each other using the result.

The alignment target 29 is formed by recognizing a predetermined land 1a (for example, a land tae close to a joint part of the partial component mounting sections 1A, see FIG. 6) and performing the laser process based on the position of the land 1ae. By doing so, a required accuracy of alignment can be secured. Further, as illustrated in FIG. 6, the alignment target 29 is formed in the area 4B, but its formation position is not limited to the area 4B, for example, it may be the partial component mounting section 1A.

The alignment target 30 of the support plate 5 is formed, for example, at a predetermined position of the support plate 5 by a mold or the like.

As an alternative technique, the alignment may be performed using predetermined lands 1a as the alignment target without using the alignment targets 29 and 30. That is, the positions of the lands 1a in the left and right two partial flexible printed circuit boards 4A are image-recognized, and the relative positions of the two partial flexible printed circuit boards 4A are adjusted so that both can have a predetermined positional relationship (for example, the distance between the lands 1a and 1a can become a pitch value between pins). As the predetermined lands, for example, the lands 1ae close to the joint part of the left and right partial flexible printed circuit boards 4A may be used.

Meanwhile, as a method of forming the alignment target 29 (the guide hole), the following method can be considered. That is, by using a mold configured to have a guide hole formed therein, guide holes of the partial flexible printed circuit boards 4A may be collectively formed at the same time when collectively cutting a plurality of partial flexible printed circuit boards 4A out from the sheet 10. According to this method, since the guide holes are collectively formed, productivity increases as compared with the above described method of separate formation. However, for example, when the partial flexible printed circuit board 4A is large, due to a variation in expansion and contraction of the partial flexible printed circuit boards 4A manufactured in the sheet 10, the position of the guide hole may be displaced from a predetermined position, and so required alignment accuracy not be secured. However, in order to secure stable alignment accuracy that does not depend on the size or the shape of the partial flexible printed circuit board 4A, it is preferable to form the alignment target individually on the partial flexible printed circuit board 4A which is cut out from the sheet as described above.

(8) Next, as illustrated in FIG. 3B (7), the two partial flexible printed circuit boards 4A are fixed onto the support plate 5. As a fixing method, for example, thermocompression bonding is performed in the case of using a coverlay as the support plate 5.

Thereafter, an unnecessary part including the area 4B in the support plate 5 is removed using a mold or the like. Further, the alignment target 29 may be used in a process of removing the unnecessary area.

The flexible printed circuit board 6 illustrated in FIG. 1 is obtained through the above described processes.

As described above, the sheet layout is performed in units of partial flexible printed circuit boards, each unit includes a partial component mounting section that is one of a predetermined number (2 in the present embodiment) of partial component mounting sections divided from one component mounting section. Thus, the area size of a manufacturing unit decreases, and the number of extending directions of the flexible cable section decreases. For this reason, the efficient layout can be achieved. As a result, compared with the conventional art, it is possible to increase the number of flexible printed circuit boards that can be obtained from one sheet. Further, it is possible to reduce sheet materials discarded. Thus, it is possible to reduce the manufacturing cost per flexible printed circuit board.

Further, by using, as a manufacturing unit, the partial flexible printed circuit board having the area size smaller than the original flexible printed circuit board, when a formation failure of a wiring or the like occurs, it is possible to reduce an affected range thereof compared to the conventional art. Thus, according to the present embodiment, the yield can improve compared to the conventional art.

For example, in the conventional art, when a foreign substance defect occurs in 10 spots in one sheet and thus 10 flexible printed circuit boards out of 20 flexible printed circuit boards manufactured from the sheet are defective, the yield is 50%. However, according to the method of the present embodiment, when a foreign substance defect occurs in 10spots in one sheet and thus 10 partial flexible printed circuit boards out of 40 partial flexible printed circuit boards manufactured in the sheet are defective, the remaining 30 partial flexible printed circuit boards are not defective. Since 15 flexible printed circuit boards are obtained by combining the non-defective partial flexible printed circuit boards, the yield is 75%. That is, in this case, it is possible to reduce a percent defective by half from 50% to 25%.

In the above described example, when the number of non-defective partial flexible printed circuit boards is an odd number, one partial flexible printed circuit board remains unused. However, in actual manufacturing, since the non-defective flexible printed circuit boards that are cut out from a plurality of sheets can be used in combination, the high yield can be maintained.

The first embodiment of the present invention has been described above, but the structure of the flexible printed circuit board according to the present embodiment is not limited to the above example. That is, a flexible printed circuit board to which the present embodiment can be applied may not have the step via structure or may have a single layer structure.

Further, the support plate 5 may be formed on the whole back surface of the partial flexible printed circuit board 4 or may be formed only on the back side of the component mounting section 1.

Dividing the component mounting section 1 is not limited to dividing the component mounting section 1 into two, left and right, partial component mounting sections 1A. The component mounting section 1 may be divided into two or more in light of the shape of the flexible printed circuit board, the area size of the fine wiring area, the yield, and the like. For example, in the case of the flexible printed circuit board 6 illustrated in FIG. 1, the component mounting section 1 may be divided using a set of pins 7a corresponding to one connection section 3 as a unit. In this case, the component mounting section 1 is divided into 6 partial component mounting sections.

Second Embodiment

Figure 7:
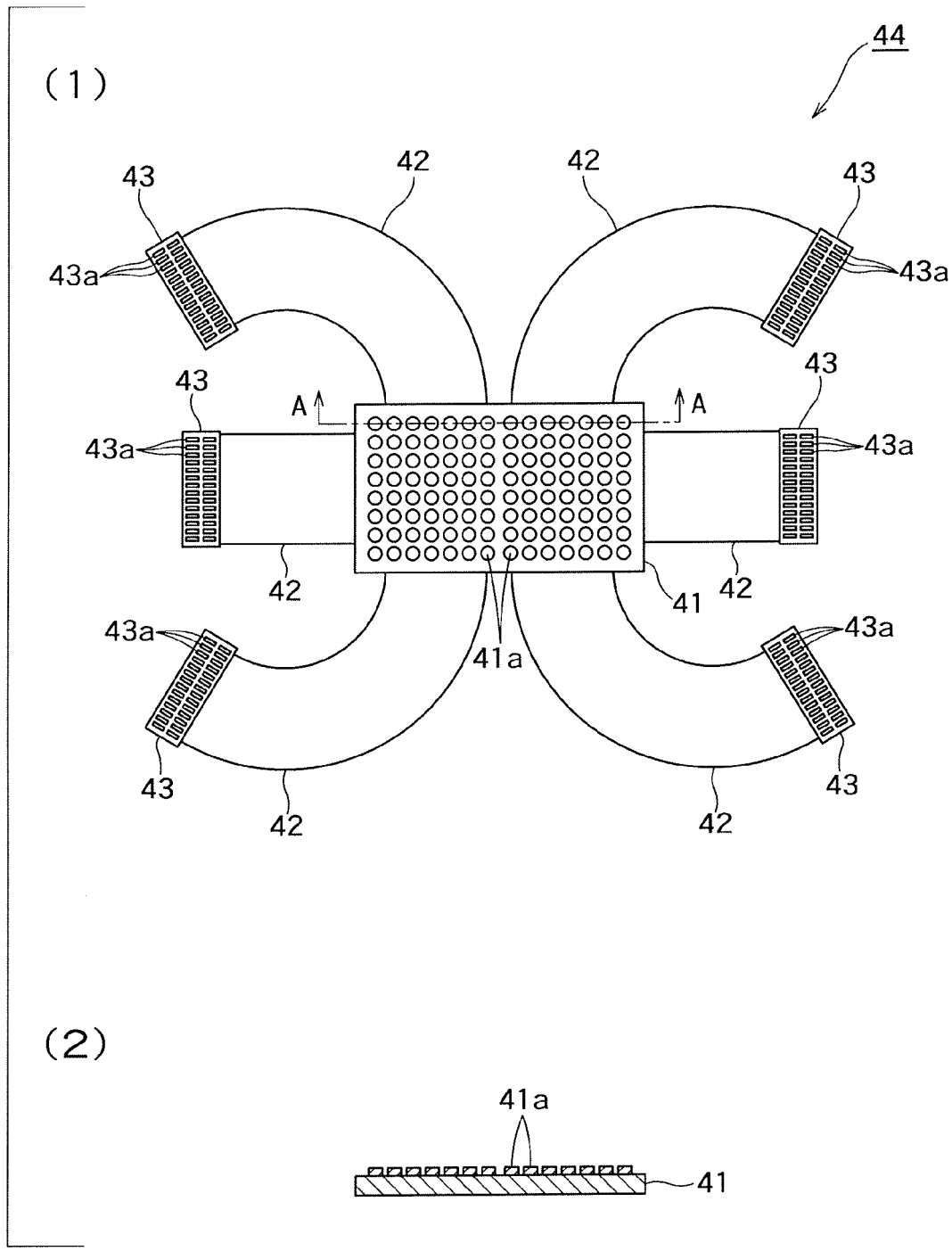
FIG. 7(1) is a plan view of a conventional flexible printed writing board, and FIG. 7(2) is a cross-sectional view taken along line A-A of FIG. 7(1).
Figure 8:
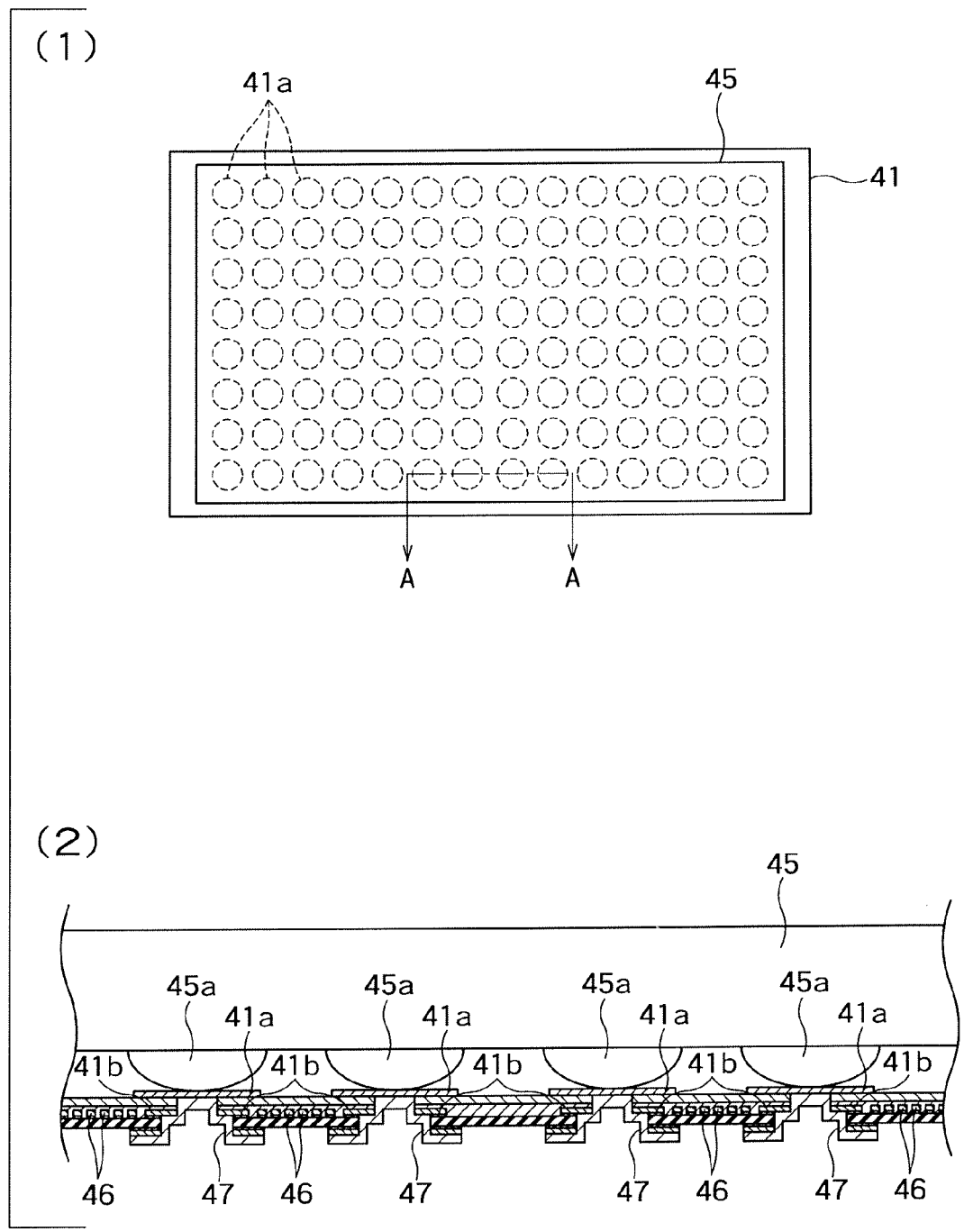
FIG. 8(1) is an enlarged plan view illustrating a state in which an electronic component 45 is mounted on a component mounting section, and FIG. 8(2) is a cross-sectional view taken along line A-A of FIG. 8(1).
Figure 16:
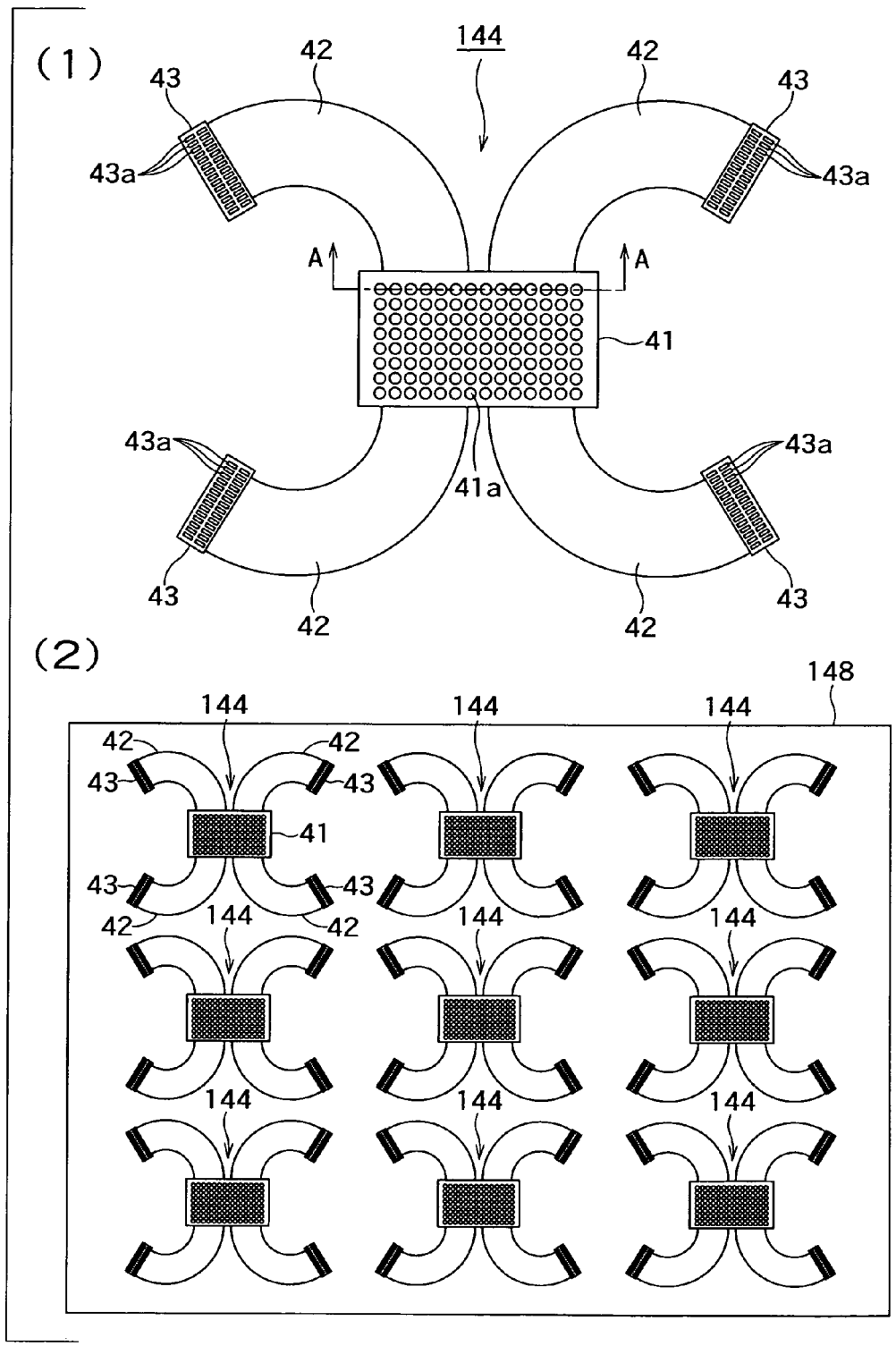
FIG. 16(1) is a plan view of a conventional flexible printed circuit board, and FIG. 16(2) is a plan view illustrating a plurality of conventional flexible printed circuit boards manufactured in a sheet.

Before describing a flexible printed circuit board according to a second embodiment, the flexible printed circuit board of a conventional manufacturing method that is functionally the same as the flexible printed circuit board according to the second embodiment will be described. FIG. 16(1) is a plan view of a flexible printed circuit board 144 according to a conventional manufacturing method. Unlike the flexible printed circuit board 44 described in the first embodiment, the flexible printed circuit board 144 does not include the flexible cable sections 42 that extend from left and right terminals of the component mounting section 41. That is, as illustrated in FIG. 16(1), in the flexible printed circuit board 144, a total of 4 flexible cable sections 42 extend from an upper end and a lower end of the component mounting section 41. A cross-sectional view taken along line A-A of FIG. 16(1) is the same as FIG. 7(2).

FIG. 16(2) is a plan view of a sheet 148 having 9 flexible printed circuit boards 144 manufactured based on a predetermined layout. As can be seen from FIG. 16(2), since the area size of the flexible printed circuit board 144 is large and the flexible cable section 42 is disposed to extend in up and down directions from the component mounting section 41, a degree of freedom of the sheet layout is restricted. For this reason, it is difficult to arrange the flexible printed circuit boards 144 in an efficient fashion within the sheet 148.

Figure 10:
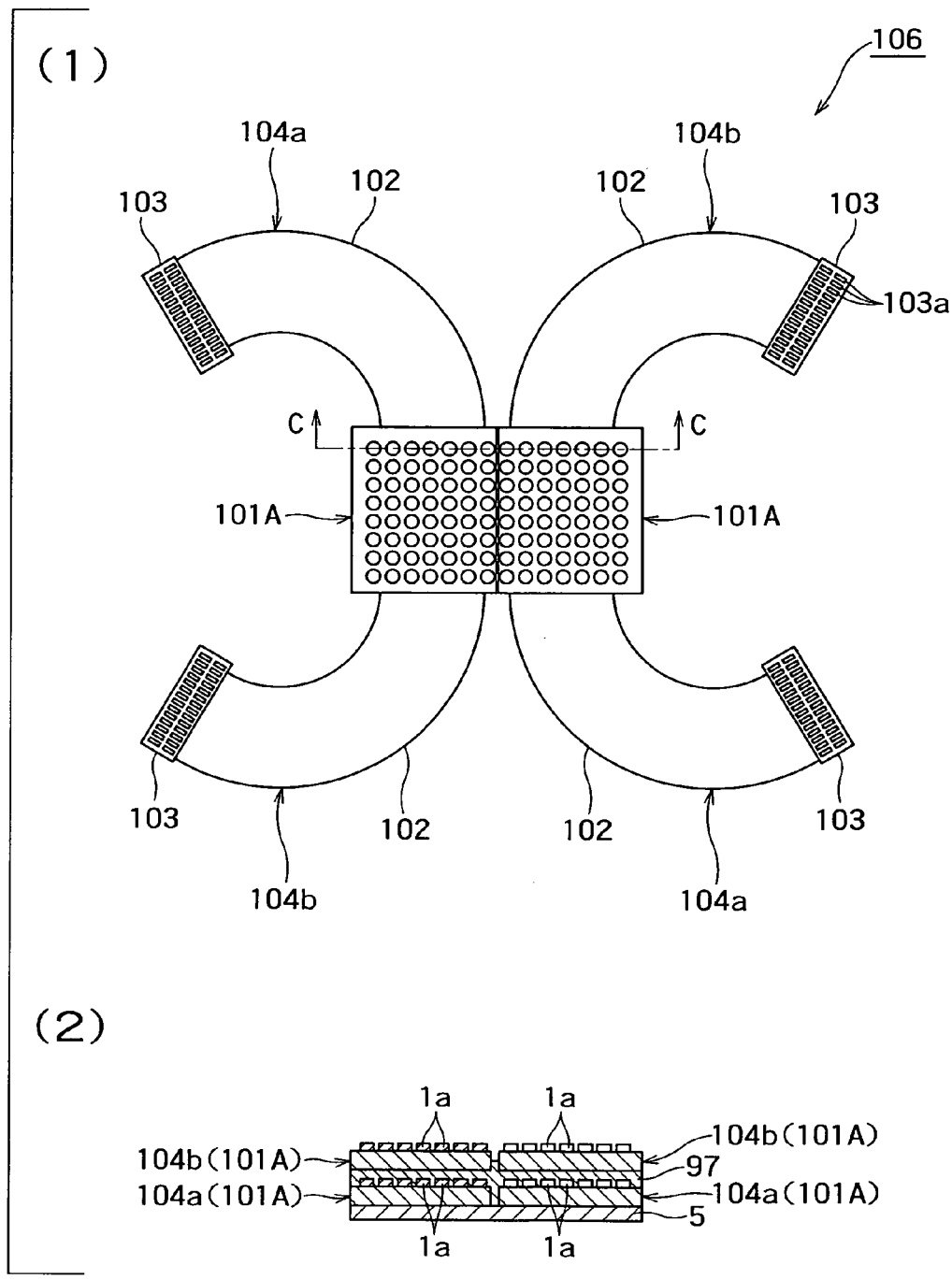
FIG. 10(1) is a plan view of a flexible printed circuit board according to a second embodiment of the present invention, and FIG. 10(2) is a cross-sectional view taken along line C-C of FIG. 10(1).

Next, the flexible printed circuit board according to the second embodiment will be described. FIG. 10(1) is a plan view of a flexible printed circuit board 106 according to the second embodiment, and FIG. 10(2) is a cross-sectional view taken along line C-C of FIG. 10(1).

As can be seen from FIGS. 10(1) and 10(2), the flexible printed circuit board 106 includes a support plate 5, left and right two partial flexible printed circuit boards 104a fixed to the support plate 5, and 2 partial flexible printed circuit boards 104b stacked on the partial flexible printed circuit boards 104a through an anisotropic conductive layer 99.

The partial flexible printed circuit boards 104a and 104b include partial component mounting sections 101A, flexible cable sections 102 that extend from the partial component mounting sections 101A, connection sections 103 disposed at leading ends of the flexible cable sections 102, respectively. In the following description, when the partial flexible printed circuit board 104a and the partial flexible printed circuit board 104b need not be discriminated from each other, they are described as the partial flexible printed circuit board 104.

As illustrated in FIG. 10(2), a total of 4 partial component mounting sections 101A which are included in the two partial flexible printed circuit boards 104a and the two partial flexible printed circuit boards 104b are combined in a horizontal direction and a vertical direction to configure the component mounting section 101. That is, a lower component mounting section is configured by arranging the partial component mounting sections 101A and 101A of the two partial flexible printed circuit boards 104a on the same plane, and an upper component mounting section is configured by arranging the partial component mounting sections 101A and 101A of the two partial flexible printed circuit boards 104b on the same plane. The component mounting section 101 is configured such that the upper component mounting section is stacked on the lower component mounting section. Lands 1a of the upper component mounting section and the lower component mounting section are the same in arrangement (number and pitch) as the lands 41a of the component mounting section 41.

The partial component mounting section 101A includes a plurality of lands 1a for being bonded with pins of an electronic component such as a sensor module on its top surface. The flexible cable section 102 has flexibility, extends from the partial component mounting section 101A in a predetermined direction, and has a plurality of fine wirings (not shown) that electrically connect the lands 1a with terminals 103a of the connection section 103. The connection section 103 (for example, a connector) has a plurality of terminals 103a for connection with an external device. The plurality of terminals 103a, are electrically connected with the corresponding lands 1a respectively through the wirings of the flexible cable section 102, respectively.

Figure 11:
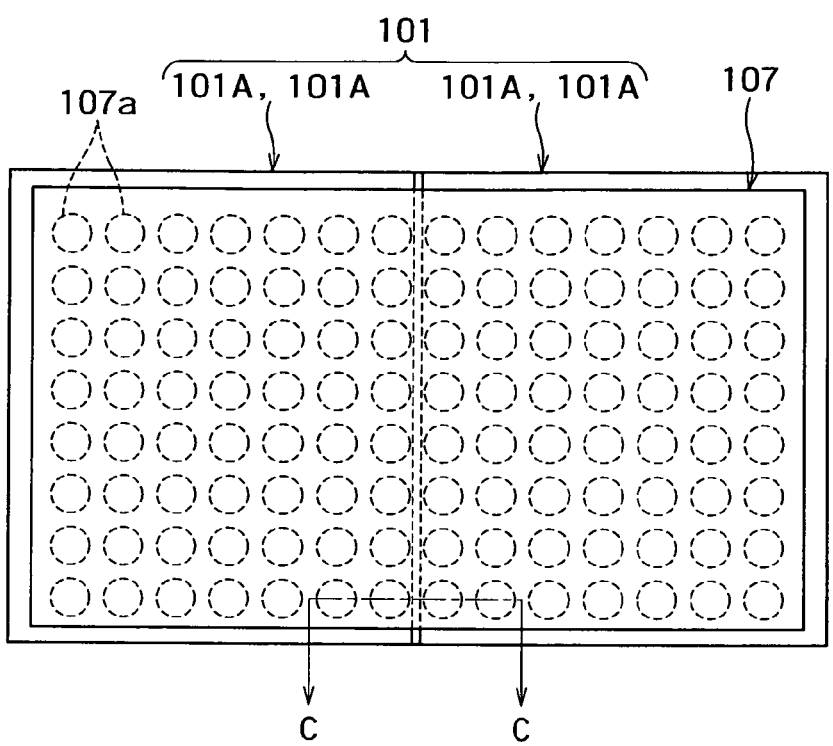
FIG. 11(1) is an enlarged plan view illustrating a state in which an electronic component is mounted on a component mounting section according to the second embodiment, and FIG. 11(2) is a cross-sectional view taken along line C-C of FIG. 11(1).
Figure 11:
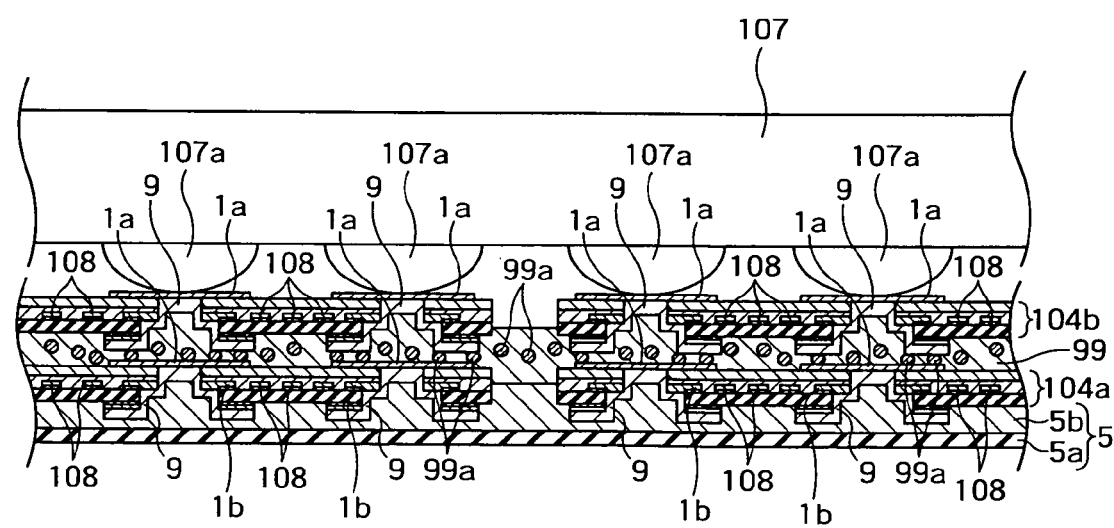

FIG. 11(1) is an enlarged plan view illustrating a state in which an electronic component 107 is mounted on the component mounting section 101 of the flexible printed circuit board 106. FIG. 11(2) is a cross-sectional view taken along line C-C of FIG. 11(1). A pin 107a of the electronic component 107 is bonded to the land 1a of the partial flexible printed circuit board 104b. The partial flexible printed circuit board 104 has a step via 9 and a fine wiring 108. The wiring 108 is a wiring for electrically connecting the land 1s with the terminal 103a of the connection section 103 and disposed between the step vias 9 and 9.

An anisotropic conductive layer 99 for bonding the partial flexible printed circuit board 104a with the partial flexible printed circuit board 104b is formed by heating an anisotropic conductive film 98 in which conductive particles 99a are dispersed. The anisotropic conductive layer 99 has anisotropic conductivity and has both conductivity and dielectric property. That is, as can been seen from FIG. 11(2), the conductive particles 99a included in the anisotropic conductive layer 99 allow an electrical connection in a vertical direction but an electrical connection in a horizontal direction is hindered. For this reason, the land 1a of the partial flexible printed circuit board 104a is electrically connected with the step via 9 of the flexible printed circuit board 104b positioned directly thereon, but an insulated state is maintained on the remaining portions. That is, the land 1a of the partial flexible printed circuit board 104b is electrically connected with the land 1s of the flexible printed circuit board 104a positioned directly thereon through the conductive particle 99a and the step via 9.

Here, a description will be made in connection with the flow of a signal between the pin 107a of the electronic component 107 and the connection section 103 of the flexible printed circuit board 106. A signal flow path is greatly divided into two. In the case of a first path, a signal output from the pin 107a of the electronic component 107 passes through the land 1a, the step via 9, and the wiring 108 formed in the partial flexible printed circuit board 104b and is transmitted to the terminal 103a through a wiring inside the flexible cable section 102 extending from the partial component mounting section 101A of the partial flexible printed circuit board 104b. In the case of a second path, it passes through the partial flexible printed circuit board 104a. That is, a signal output from the pin 107a passes through the land 1s and the step via 9 formed in the partial flexible printed circuit board 104b, passes through the land 1a, the step via 9, and the wiring 8 formed in the partial flexible printed circuit board 104a, and is transmitted to the terminal 103a through a wiring inside the flexible cable section 102 extending from the partial component mounting section 101A of the partial flexible printed circuit board 104b.

When the electronic component 107 is the sensor module, the pin 107a and the terminal 103a have a one-to-one correspondence relationship. In this case, in FIG. 11(2), one of the vertically arranged step vias 9 is provided as a dummy and thus is not actually used.

As can be understood from the above description, the flexible printed circuit board 106 has the same function as the above described flexible printed circuit board 144.

Since the flexible printed circuit board 106 is configured by laminating the partial flexible printed circuit boards 104 in two stages including upper and lower stages, the number of partial component mounting sections is as twice as that of the first embodiment. Thus, the number of wirings formed in one partial component mounting section decreases, and so the wiring density can be alleviated. Specifically, in the first embodiment, 6 wirings 8 are disposed between the step vias 9 (see FIG. 2(2)), but in the second embodiment, as illustrated in FIG. 11(2), 3 wirings that are half are disposed betweens the step vias 9. In terms of a numerical value as an example, in the case where 6 wirings are installed between the inner layer lands 1*b* disposed at an interval of 200 μm, a wiring interval in the present embodiment is 60 μm, whereas it is 30 μm in the first embodiment.

Next, a method of manufacturing the flexible printed circuit board 106 according to the present embodiment will be described with reference to FIGS. 12A to 14B.

(1) The partial flexible printed circuit boards 104*a* and 104*b* illustrated in FIG. 12A(1) are obtained through the same processes described with reference to FIGS. 3A(1) to 3A(4) and FIG. 3B(5) in the first embodiment. One of different points from the first embodiment is that the wiring 108 is larger in pitch than the wiring 8. Another different point is the sheet layout of the partial flexible printed circuit boards 104*a* and 104*b*, which will be described with reference to FIG. 13.

Figure 13:
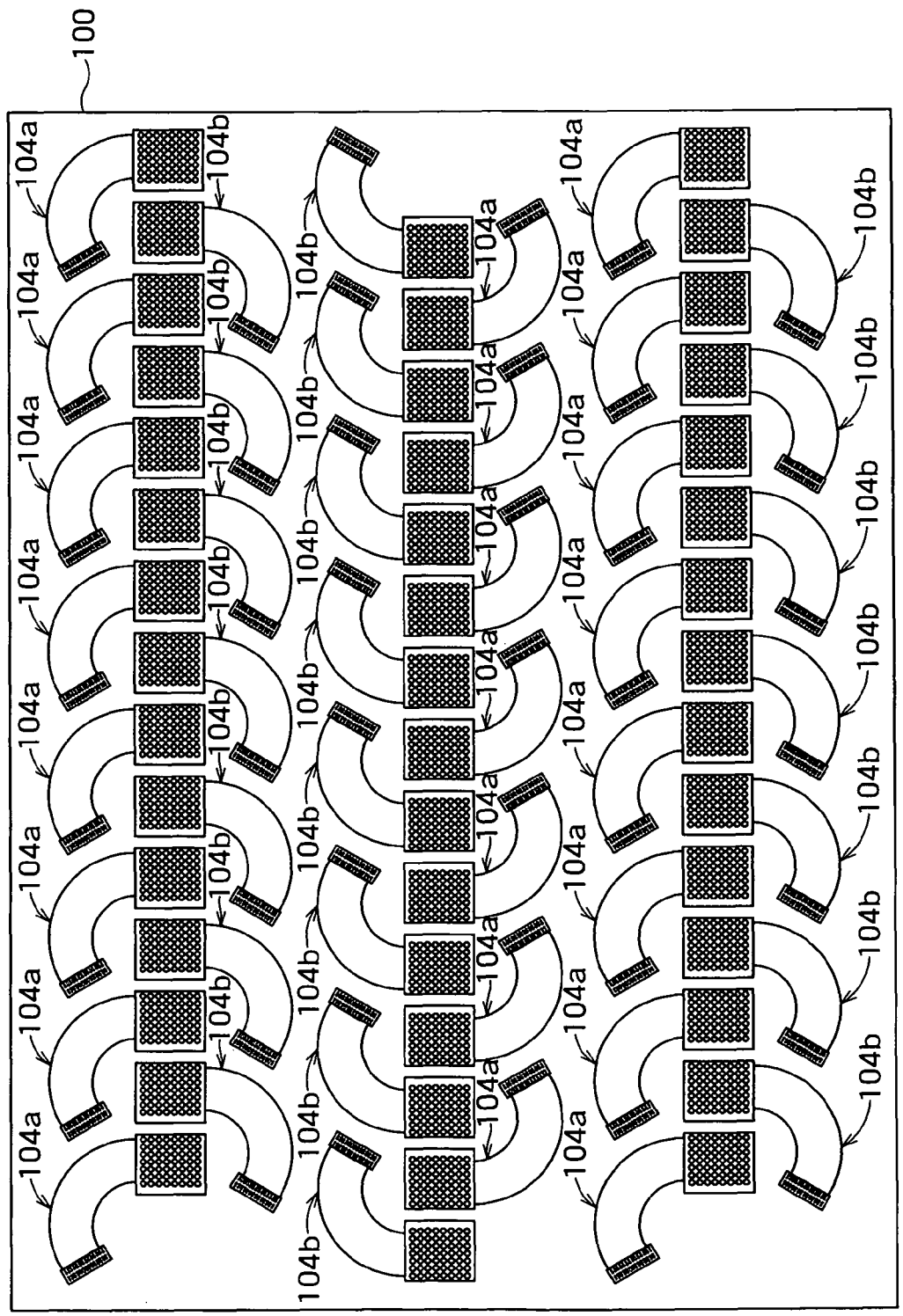
FIG. 13 is a plan view illustrating a plurality of partial flexible printed circuit boards, which are manufactured in a sheet, according to the second embodiment.

FIG. 13 is a plan view illustrating the partial flexible printed circuit boards 104*a* and 104*b* manufactured in a sheet 100 of the same size as the above described sheet 148. As can be seen from FIG. 13, one flexible cable section 102 extends from one partial flexible printed circuit board 104*a* or 104*b*. The partial flexible printed circuit boards 104*a* and 104*b* are different in bending direction of the flexible cable section 102 and thus do not have the same shape.

Further, instead of manufacturing both the partial flexible printed circuit board 104*a* and the partial flexible printed circuit board 104*b* in one sheet as illustrated in FIG. 13, the partial flexible printed circuit board 104*a* may be manufactured in one sheet, and the partial flexible printed circuit board 104*a* may be manufactured in another sheet.

Compared to the flexible printed circuit board 144, the partial flexible printed circuit board 104 is small in area size and number of extending directions of the flexible cable sections. For this reason, it allows an efficient sheet layout of the partial flexible printed circuit boards 104 in the sheet 100. As a result, it is possible to increase the number of flexible printed circuit boards obtained from one sheet. Specifically, as illustrated in FIG. 13, 23 partial flexible printed circuit boards 104*a* and 22 partial flexible printed circuit boards 104*b* can be arranged within one sheet. One flexible printed circuit board 106 is configured with the two partial flexible printed circuit boards 104*a* and the two partial flexible printed circuit boards 104*b*. For this reason, a maximum of 11 flexible printed circuit boards 106 can be obtained from one sheet. Meanwhile, in the conventional example illustrated FIG. 16, a maximum of 9 flexible printed circuit boards can be obtained.

(2) Next, the partial flexible printed circuit board 104 is cut out from the sheet 100 using a mold or the like. As can be seen from FIG. 14A, the cut partial flexible printed circuit board 104 may have the area 104B to be provided with the alignment target 129 thereon. The area 104B is finally removed as will be described later. After cut out from the sheet, the partial flexible printed circuit board 104 is subjected to a failure judgment, and a defective one is removed. In the present embodiment, since the wiring 108 is as about twice thick as the wiring 8, a probability that a failure is caused by wiring formation can decrease by half. Further, as necessary, after the partial flexible printed circuit board 104 is cut out, surface processing such as solder plating, nickel plating or gold plating on a terminal surface such as a land section and forming a protective photo-solder resist layer on a part where soldering is unnecessary, and an outward shape processing are performed.

Figure 12A:
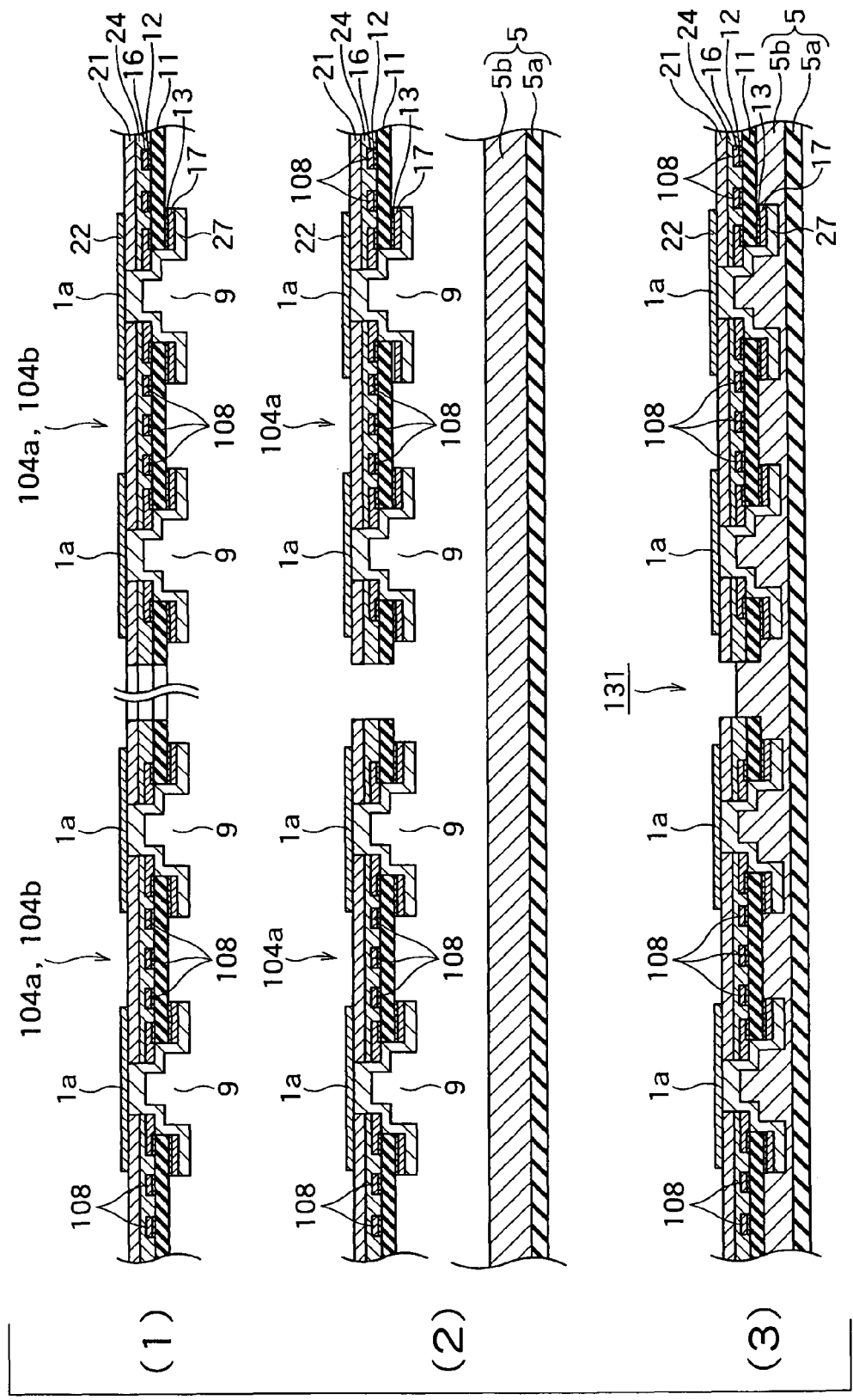
FIG. 12A is a process cross-sectional view illustrating a method of manufacturing a flexible printed circuit board according to the second embodiment.

(3) Next, as illustrated in FIG. 12A(2), the partial component mounting sections 101A and 101A of the two partial flexible printed circuit boards 104*a* are combined and aligned to configure a lower component mounting section.

Figure 14A:
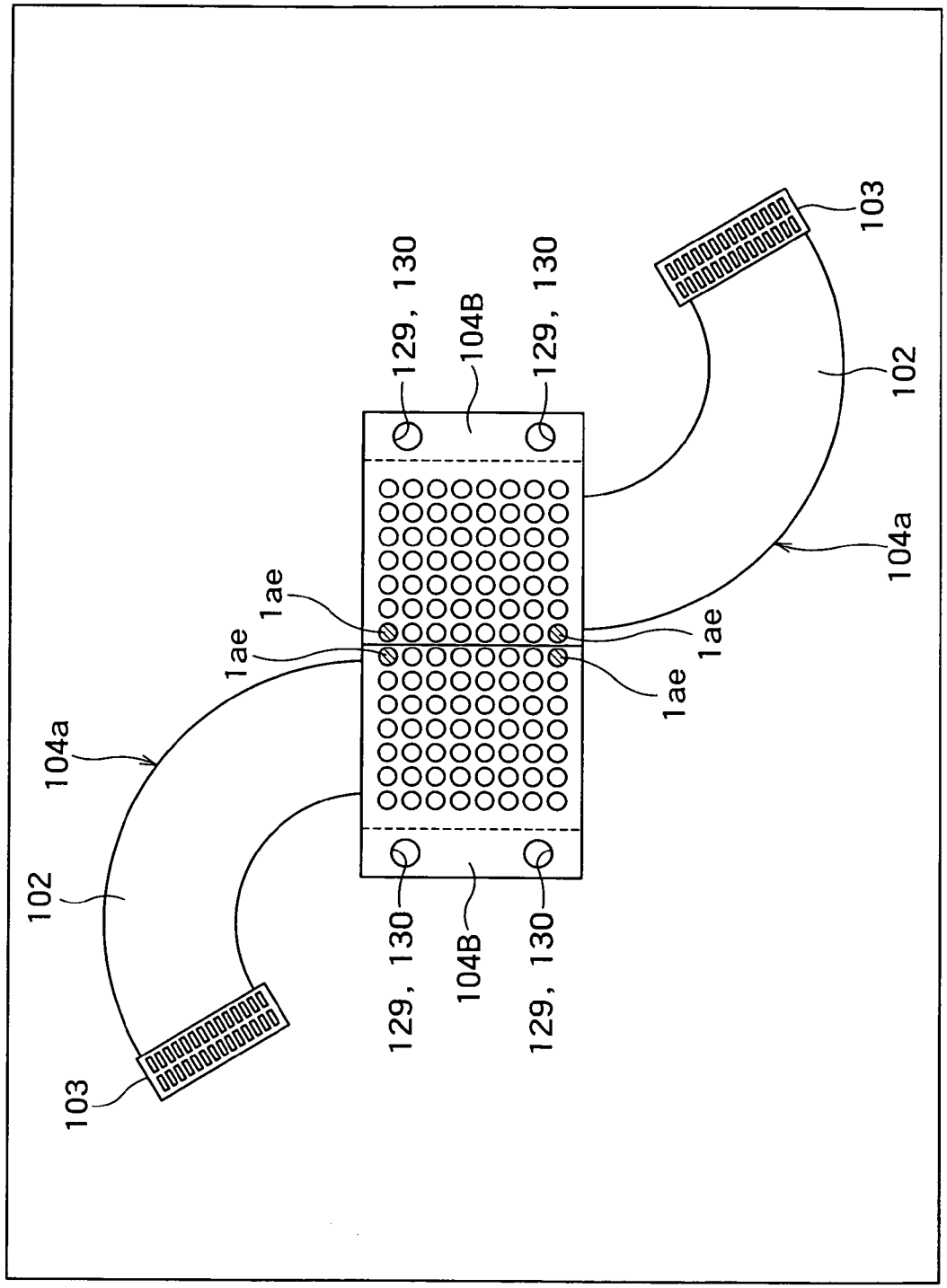
FIG. 14A is a plan view illustrating aligned partial flexible printed circuit boards according to the second embodiment.

For example, the alignment is performed using the alignment targets 129 and 130 respectively formed on the partial flexible printed circuit board 104*a* and the support plate 5 such that the alignment targets 129 and 130 can match with each other. The alignment targets 129 and 130 are guide holes or alignment marks formed with high accuracy and formed in the same manner as described in the first embodiment. FIG. 14A is a plan view of the partial flexible printed circuit boards 104*a* aligned on the support plate 5. As illustrated in FIG. 14A, the alignment target 129 of the partial flexible printed circuit board 104*a* matches with the alignment target 130 of the support plate 5.

Further, as an alternative alignment method, without using the alignment targets 129 and 130, the alignment may be performed by image-recognizing the positions of predetermined lands (for example, lands 1*ae* illustrated in FIG. 14A) in the left and right two partial flexible printed circuit boards 104*a* and positioning them to be in a predetermined position relationship.

(4) Next, the aligned two flexible printed circuit boards. 104*a* are placed on the support plate 5 and fixed by thermo-compression bonding or the like. The support plate 5 supports at least the lower component mounting section of the partial flexible printed circuit boards 104*a*.

A lower flexible printed circuit board 131 illustrated in FIG. 12A(3) is obtained through the processes up to this point.

Figure 12B:
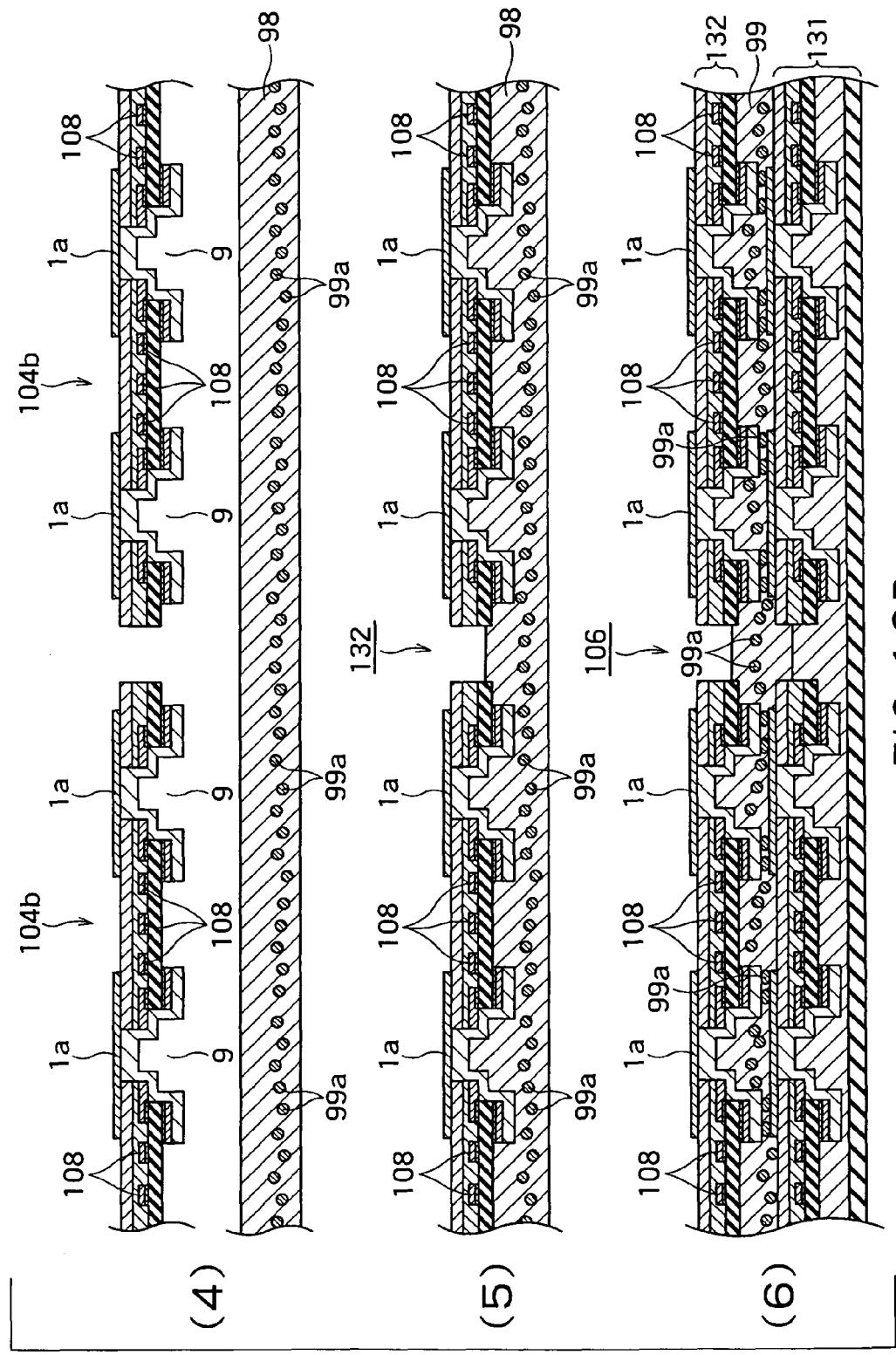
FIG. 12B is a process cross-sectional view illustrating a method of manufacturing a flexible printed circuit board according to the second embodiment, subsequent to FIG. 12A.

(5) Next, as illustrated in FIG. 12B(4), the partial component mounting sections 101A and 101A of the two partial flexible printed circuit boards 104*b* are combined and aligned to configure an upper component mounting section.

For example, the alignment is performed using alignment targets respectively formed on the partial flexible printed circuit board 104*b* and the anisotropic conductive film (ACF) 98 such that the alignment targets can match with each other. As an alternative alignment method, the alignment may be performed by image-recognizing the positions of predetermined lands (for example, lands 1*ae* illustrated in FIG. 14B) in the left and right two partial flexible printed circuit boards 104*b* and positioning them to be in a predetermined position relationship.

(6) Next, the aligned two flexible printed circuit boards 104*b* are attached and fixed onto the anisotropic conductive film 98 (for example, a thickness of 50 μm). The anisotropic conductive film 98 supports at least the upper component mounting section of the partial flexible printed circuit boards 104*b*.

At this point, ANISOLM AC-200 (available from Hitachi Chemical Co., Ltd.) of a high-heat resistance specification was used as the anisotropic conductive film 98 under the assumption that a reflow process that is a high temperature process is performed when the electronic component 107 is mounted.

An upper flexible printed circuit board 132 illustrated in FIG. 12B(5) is obtained through the processes up to this point.

Figure 14B:
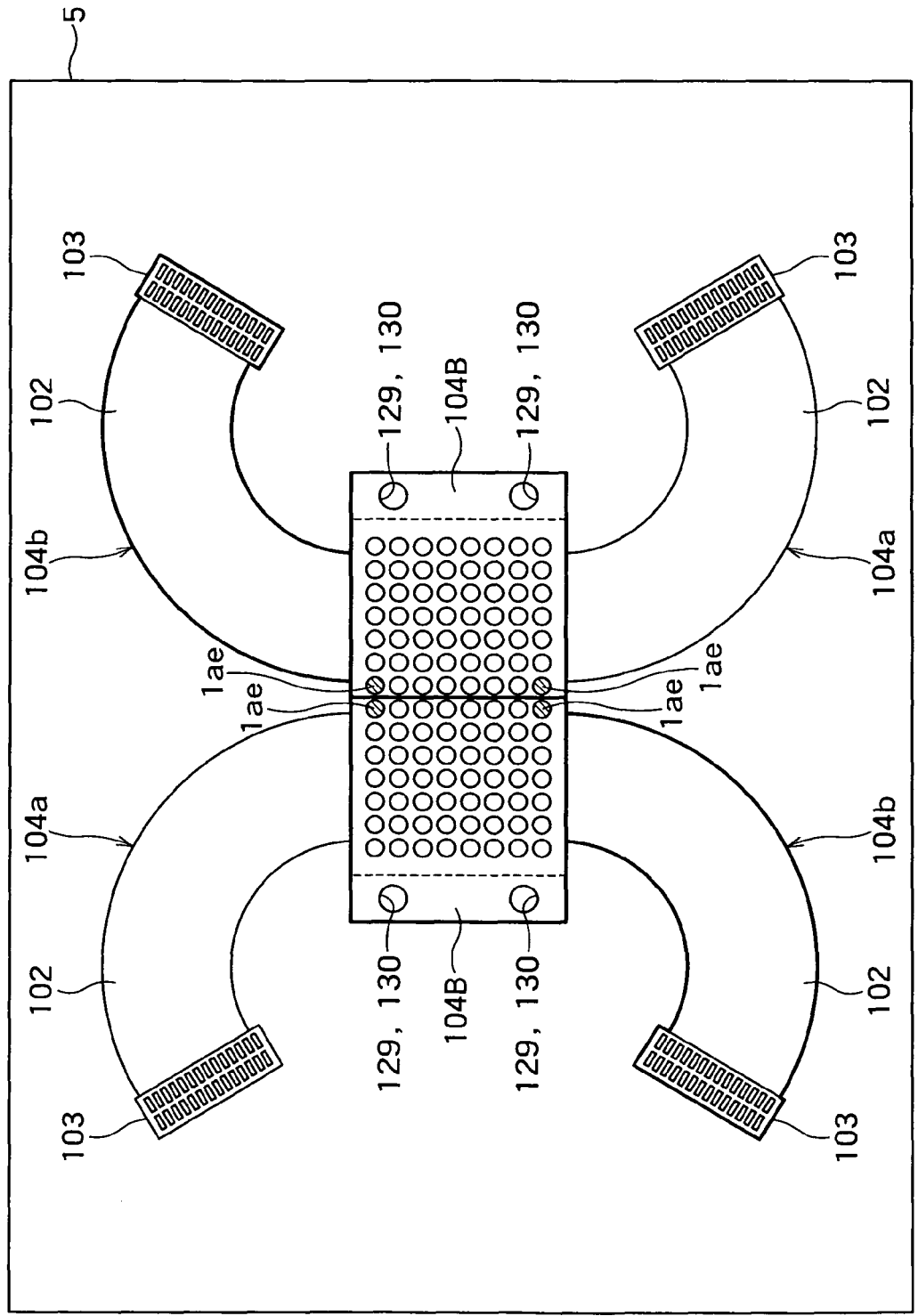
FIG. 14B is a plan view illustrating aligned partial flexible printed circuit boards according to the second embodiment.

(7) Next, as illustrated in FIG. 14B, the upper flexible printed circuit board 132 is aligned with the lower flexible printed circuit board 131. The alignment is performed such that the upper component mounting section of the upper flexible printed circuit board 132 is positioned directly on the lower component mounting section of the lower flexible printed circuit board 131. For example, the alignment is preferably performed such the alignment target 129 of the lower flexible printed circuit board 131 can match with the alignment target 130 of the upper flexible printed circuit board 132.

(8) Next, after the upper flexible printed circuit board 132 is placed on the lower flexible printed circuit board 131, heating and pressurizing are performed. Here, heating and pressurizing have been performed for 5 seconds under the condition of 220° C. in temperature and 4 MPa in pressure. As a result, as illustrated in FIG. 12B(6), the anisotropic conductive film 98 is melt to become an anisotropic conductive film 99 that fills the step via 9 of the partial flexible printed circuit board 104b and attaches the upper flexible printed circuit board 132 to the lower flexible printed circuit board 131. As illustrated in FIG. 12B(6), interlayer conduction is obtained by the conductive particles 99a between the land 1a of the partial flexible printed circuit board 104a and the step via 9 of the partial flexible printed circuit board 104b. That is, the present process produces the component mounting section 101 which includes the upper component mounting section and the lower component mounting section and in which the land 1a of the lower component mounting section is electrically connected with the land 1a of the upper component mounting section positioned directly thereon through the conductive particles 99a and the step via 9.

(9) Next, an unnecessary area such as the area 104B is removed using a mold or the like, so that the flexible printed circuit board 106 illustrated in FIG. 10 is obtained.

Thereafter, as described with reference to FIG. 11, the electronic component 107 such as the sensor module is mounted on the flexible printed circuit board 106. In the present embodiment, since the anisotropic conductive film 98 of the high-heat resistance specification is used, the electronic component has been mounted by the reflow process.

In the case of using a general anisotropic conductive film that does not have the high-heat resistance specification, if the high temperature process such as the reflow process is used, the process temperature exceeds a heat-resistance temperature of the anisotropic conductive film. Thus, in this case, it is necessary to use a method of mounting the electronic component at a relatively low temperature. For example, an ultrasonic connection technique may be used. In this technique, the pin 107a is connected with the land 1a such that gold plating or the like is performed on the pin 107a and the land 1a, the electronic component 107 is placed on the flexible printed circuit board 106, and then plating metal is heated by ultrasonic vibration.

Figure 15:
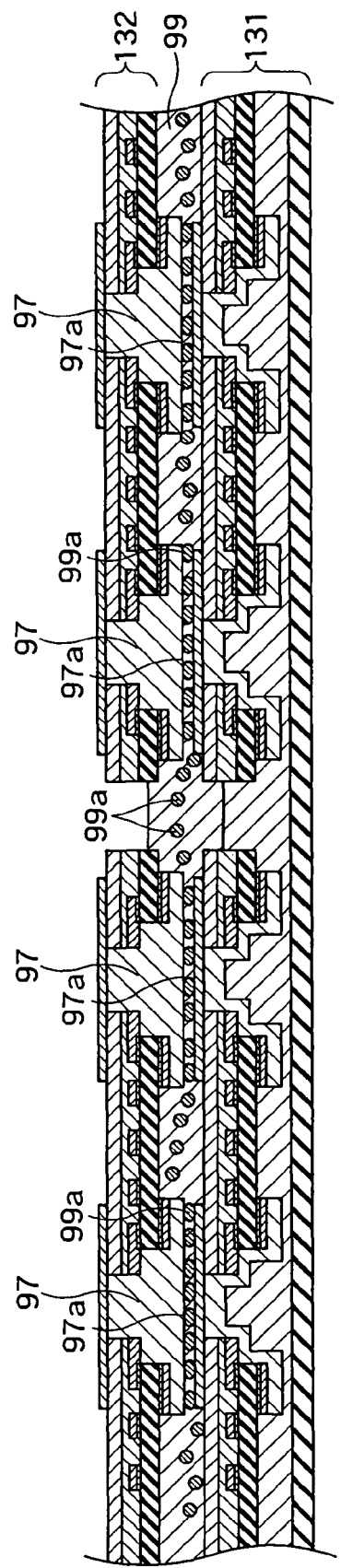
FIG. 15 is a cross-sectional view of a flexible printed circuit board according to a modification of the second embodiment.

Further, the step via 9 may be a filled via, that is, a step via hole filled with a conductor. FIG. 15 is a cross-sectional view of a flexible printed circuit board in which a filed via 97 is formed on the upper flexible printed circuit board 132. With such a filled via structure, flatness in the back surface of the partial flexible printed circuit board 104b (a lower side in FIG. 15) improves. For this reason, as can be seen from FIG. 15, it is possible to increase the number of the conductive particles 99a that are present between an open surface 97a of the filled via 97 and the land 1a of the lower flexible printed circuit board 131 directly below the open surface of the field via. As a result, connection reliability of an interlayer conduction path can improve. Further, as a method of forming the filled via 97, a via fill plating technique using a plating solution containing a special additive or a technique of filling a step via hole with a conductive paste may be used.

Further, in the present embodiment, the component mounting section has been divided into two layers including upper and lower layers, but the present invention is not limited thereto. The flexible printed circuit board may be configured by laminating three or more partial flexible printed circuit boards.

As described above, according to the second embodiment, the same effect as in the first embodiment is obtained. Further, by employing the laminate structure for the component mounting section, the number of partial component mounting sections 101A increases, leading to a decrease in the number of wirings formed in one partial component mounting section, which results in a reduction in the wiring density. As a result, a failure caused by formation of fine wirings can decrease by half. In actual manufacturing, since indefective partial flexible printed circuit boards that are cut out from a plurality of sheets can be combined, the yield can increase further.

The second embodiment according to the present invention has been described above, but the structure of the flexible printed circuit board according to the present invention is not limited to the above embodiments.

The number of flexible cable sections and the direction extending from the component mounting section are not limited to the above described embodiment.

Further, without disposing the connection section 3 (103), a configuration in which an additional component mounting section (for example, on which a semiconductor integrated circuit processing a signal of the sensor, module mounted on the component mounting section 1(101), is mounted) may be integrally connected with the flexible cable section may be used.

Further, the interlayer conduction path for obtaining interlayer conduction is not limited to the step via but may be a different type of via or a through via. Those who skilled in the art can expect an additional effect or various modifications of the present invention, but aspects of the present invention are not limited to the above described embodiments. Various additions, changes, and partial deletions can be made in a range not departing the conceptual spirit and purpose of the present invention derived from matters set forth in claims and equivalents.

DESCRIPTION OF LETTERS OR NUMERALS 1, 41, 101 component mounting section
1A, 101A partial component mounting section
1a, 1ae, 41a land
1b, 41b inner land
2, 42, 102 flexible cable section
3, 43, 103 connection section
3a, 43a, 103a terminal
4, 4A, 104a, 104b, 104 partial flexible printed circuit board
48, 104B area
5 support plate
5a insulating film
5b adhesive material layer
6, 44, 106, 144 flexible printed circuit board
7, 45, 107 electronic component
7a, 45a, 107a pin
8, 46, 108 wiring
9, 47 step via
10, 48, 100, 148 sheet
11, 21 flexible insulating base material
12, 13, 22 copper foil
14 dual-side copper-clad laminated sheet
15A. 15B plating resist layer
16, 17, 27 electrolyte copper plating layer
18, 19 conformal mask
20 dual-side circuit base material 23 single-side cooper-clad laminated sheet
24 adhesive material layer
25 multi-layer circuit base material
26 step via hole
28 outer layer pattern
29, 30, 129, 130 alignment target
97 filled via
97a open surface
98 anisotropic conductive film
99 anisotropic conductive layer
99a conductive particles
131 lower flexible printed circuit board
132 upper flexible printed circuit board

The invention claimed is:

1. A method of manufacturing a flexible printed circuit board that includes a component mounting section for mounting an electronic component and a plurality of flexible cables extending in different directions from the component mounting section and extending in different directions from one another, comprising:
   manufacturing a plurality of partial flexible printed circuit boards in a predetermined sheet, each of the partial flexible printed circuit board including a partial component mounting section formed by dividing the component mounting section into a predetermined number of parts and a flexible cable extending from the partial component mounting section, the flexible cable being one of the plurality of flexible cables;
   cutting an area including the partial flexible printed circuit board from the sheet;
   after cutting the area from the sheet, performing an alignment of the predetermined number of partial flexible printed circuit boards such that the predetermined number of partial component mounting sections are combined to configure the component mounting section for mounting an electronic component; and
   after the alignment, fixing the predetermined number of aligned partial flexible printed circuit boards to a flexible support plate such that the predetermined number of aligned partial flexible printed circuit boards are arranged adjacent to each other.

2. The method of manufacturing the flexible printed circuit board according to claim 1, wherein the alignment includes the steps of:
   forming alignment targets in the partial flexible printed circuit board and the support plate, respectively;
   image-recognizing the alignment targets; and adjusting positions of the partial flexible printed circuit boards in such a manner that the alignment target of the partial flexible printed circuit board matches with the alignment target of the support plate, using the result of the image-recognition.

3. The method of manufacturing the flexible printed circuit board according to claim 2, wherein the alignment target of the partial flexible printed circuit board is formed with reference to a position of a predetermined land of the partial component mounting section by recognizing the predetermined land.

4. The method of manufacturing the flexible printed circuit board according to claim 1, wherein the alignment includes the steps of:
   image-recognizing a predetermined land of the partial component mounting section; and
   adjusting relative positions of the predetermined number of partial flexible printed circuit boards with reference to a position of the land.

5. The method of manufacturing the flexible printed circuit board according to claim 1, wherein an aramid resin film having an adhesive layer is used for the support plate.

6. A flexible printed circuit board, comprising:
   a predetermined number of individual partial flexible printed circuit boards each of which includes a partial component mounting section formed by dividing a component mounting section for mounting an electronic component into a predetermined number of parts and a flexible cable extending from the partial component mounting section; and
   a flexible support plate which fixes individually the predetermined number of partial flexible printed circuit boards in such a manner that the predetermined number of partial component mounting sections are combined to configure the component mounting section and that the flexible cables of the predetermined number of partial flexible printed circuit board extend in different directions from the component mounting section and extend in different directions from one another.

7. The flexible printed circuit board according to claim 6, wherein the support plate comprises an aramid resin film having an adhesive layer.

8. A flexible printed circuit board, comprising:
   a predetermined number of individual partial flexible printed circuit boards each of which includes a partial component mounting section formed by dividing a component mounting section for mounting an electronic component into a predetermined number of parts and a flexible cable extending from the partial component mounting section and extending in different directions from one another; and
   a flexible support plate which fixes individually the predetermined number of partial flexible printed circuit boards in such a manner that the predetermined number of partial component mounting sections are combined to configure the component mounting section and that the flexible cables of the predetermined number of partial flexible printed circuit board extend in different directions from the component mounting section and extend in different directions from one another;
   wherein
   a connection section having a plurality of terminals is provided at a leading end of the flexible cable;
   the partial component mounting section includes a plurality of lands;
   the flexible cable has a plurality of wirings that electrically connect the land with the terminal.

* * * * *